United States Patent
Aiba et al.

(10) Patent No.: US 10,814,627 B2
(45) Date of Patent: Oct. 27, 2020

(54) LIQUID DISCHARGE HEAD

(71) Applicant: Brother Kogyo Kabushiki Kaisha, Nagoya-shi, Aichi-ken (JP)

(72) Inventors: Takashi Aiba, Nagoya (JP); Keiji Kura, Chita (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 0 days.

(21) Appl. No.: 16/353,276

(22) Filed: Mar. 14, 2019

(65) Prior Publication Data
US 2019/0299616 A1      Oct. 3, 2019

(30) Foreign Application Priority Data

Mar. 28, 2018  (JP) .................. 2018-062523
Mar. 28, 2018  (JP) .................. 2018-062524

(51) Int. Cl.
*B41J 2/14* (2006.01)
*H01L 41/047* (2006.01)

(52) U.S. Cl.
CPC ....... *B41J 2/14274* (2013.01); *B41J 2/14233* (2013.01); *H01L 41/047* (2013.01); *B41J 2002/14258* (2013.01); *B41J 2002/14306* (2013.01); *B41J 2002/14459* (2013.01); *B41J 2002/14491* (2013.01)

(58) Field of Classification Search
CPC ............... B41J 2/14274; B41J 2/14233; B41J 2002/14258; B41J 2002/14306; B41J 2002/14459; B41J 2002/14491; H01L 41/047

See application file for complete search history.

(56) References Cited

U.S. PATENT DOCUMENTS

2009/0096844 A1* 4/2009 Kojima ............... B41J 2/14274
                                                              347/72
2009/0141092 A1* 6/2009 Koide ................. H01L 41/0926
                                                              347/68

FOREIGN PATENT DOCUMENTS

JP        2011-212865 A        10/2011

* cited by examiner

*Primary Examiner* — Geoffrey S Mruk
(74) *Attorney, Agent, or Firm* — Banner & Witcoff, Ltd.

(57) ABSTRACT

There is provided a liquid discharge head including: a piezoelectric body, a common electrode, a bypass trace, and a plurality of individual electrodes. The piezoelectric body is provided with: a first through hole extending in a stacking direction between a conductive layer constructing the piezoelectric body and a first extending portion of the common electrode, and a second through hole extending in the stacking direction between the conductive layer and the first extending portion. The conductive layer and the first extending portion are electrically connected to each other by a conductive material arranged in the first and second through holes.

23 Claims, 18 Drawing Sheets

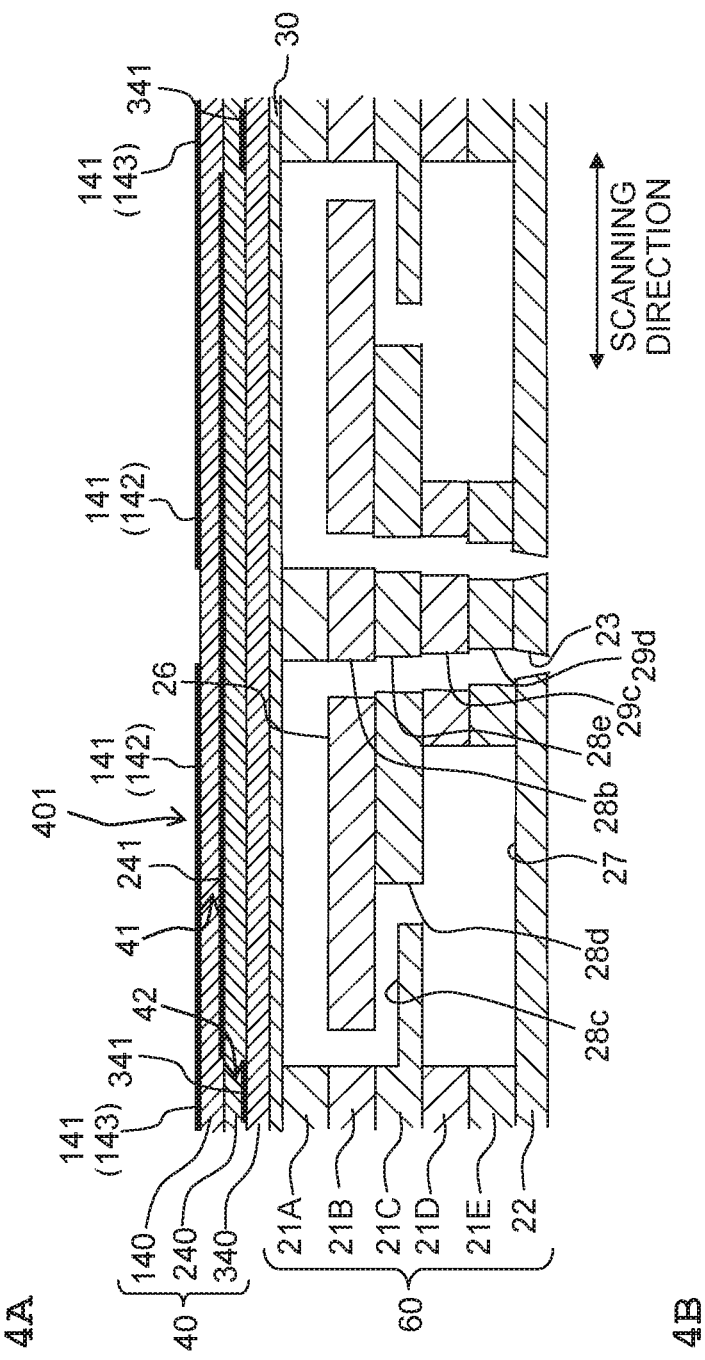
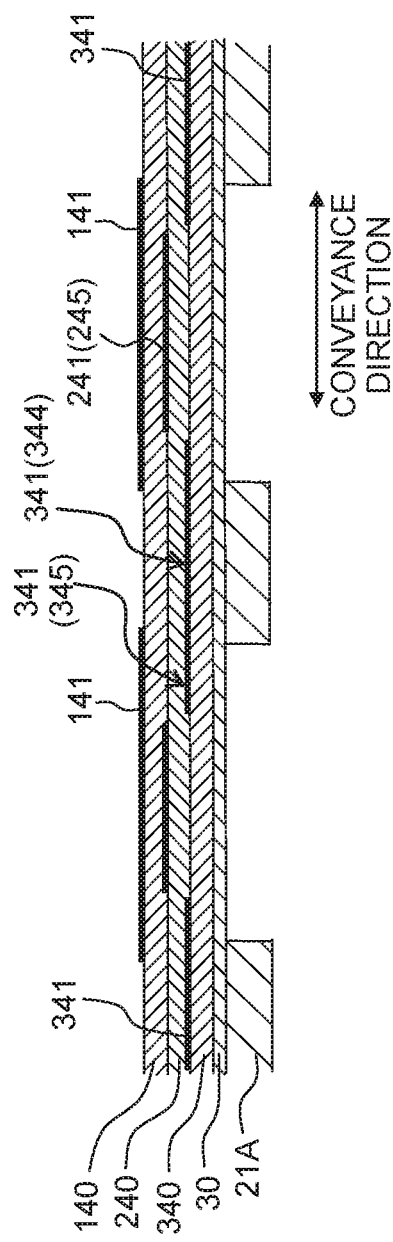
Fig. 4A
Fig. 4B

CONVEYANCE DIRECTION

SCANNING DIRECTION

NEUTRAL PLANE NP

THERMAL STRESS

SCANNING DIRECTION

LIQUID DISCHARGE HEAD

CROSS REFERENCE TO RELATED APPLICATION

The present application claims priorities from Japanese Patent Application No. 2018-062523, filed on Mar. 28, 2018 and Japanese Patent Application No. 2018-062524, filed on Mar. 28, 2018, the disclosures of which are incorporated herein by reference in their entireties.

BACKGROUND

Field of the Invention

The present disclosure relates to a liquid discharge head discharging liquid such as ink, etc., toward a medium.

Description of the Related Art

As a liquid discharge apparatus (liquid jetting apparatus), there is known an ink jet head, of an ink-jet printer, which discharges (jets) an ink toward a recording medium to thereby form an image on the recording medium while moving relative to the recording medium. For example, there is a publicly-known ink-jet head having a piezoelectric body in which a plurality of piezoelectric material layers (ceramics sheets) are layered or stacked.

SUMMARY

This publicly-known ink-jet head has the piezoelectric body in which the plurality of piezoelectric material layers are stacked. A plurality of rows of individual electrodes are formed in a piezoelectric material layer as an uppermost layer in the plurality of piezoelectric material layers, and a common electrode is formed in an intermediate piezoelectric material layer in the plurality of piezoelectric material layers. A surface layer configured to supply electric potential to the common electrode formed in the intermediate piezoelectric material layer is also formed in the uppermost piezoelectric material layer. The surface layer extends in a direction orthogonal to a direction in which the plurality of rows of individual electrodes extend, between an end portion of the uppermost piezoelectric material layer and the plurality of rows of individual electrodes. A plurality of through holes are formed between the surface electrode and the common electrode, and a conductive material charged (filled) in the plurality of through holes allows the surface and common electrodes to electrically conducted with each other. With this, the electric potential can be made constant in respective parts or portions of the common electrode.

However, if such a case is provided that, for example, a sufficient amount of the conductive material is not charged in a certain through hole among the plurality of through holes, due to which any electric disconnection is caused at the certain through hole; in such a case, it is difficult to supply the electric charge, via another through hole, to a location at which the electric charge has been supplied via the certain, disconnected through hole.

An object of the present disclosure is to provide a liquid discharge head wherein, even in such a case for example that a sufficient amount of the conductive material is not charged in a certain through hole among the plurality of through holes, due to which any electric disconnection is caused at the certain through hole, it is possible to supply the electric charge, via another through hole, to a location at which the electric charge has been supplied via the certain, disconnected through hole.

According to an aspect of the present disclosure, there is provided a liquid discharge head including: a piezoelectric body including a plurality of piezoelectric layers which are stacked in a stacking direction, the piezoelectric body having a first end and a second end which are separated in a first direction orthogonal to the stacking direction, and a third end and a fourth end which are separated in a second direction orthogonal to the first direction and the stacking direction; a common electrode formed in a first plane which is a plane orthogonal to the stacking direction; a bypass trace formed in a second plane which is orthogonal to the stacking direction and of which position in the stacking direction is different from a position in the stacking direction of the first plane; and a plurality of individual electrodes formed in the second plane or a third plane which is orthogonal to the stacking direction and of which position in the stacking direction is different from the position in the stacking direction of the first plane and the position in the stacking direction of the second plane. The plurality of individual electrodes construct a plurality of individual electrode rows arranged between the first end and the second end with an interval therebetween. The plurality of individual electrode rows include: a first individual electrode row and a second individual electrode row which is arranged side by side with respect to the first individual electrode row in the first direction, the first individual electrode row being positioned between the first end and the second individual electrode row in the first direction, the second individual electrode row being positioned between the first individual electrode row and the second end in the first direction; individual electrodes included in the plurality of individual electrodes and constructing the first individual electrode row are aligned in the second direction; individual electrodes included in the plurality of individual electrodes and constructing the second individual electrode row are aligned in the second direction. The common electrode includes: a first extending portion extending in the first direction, between the fourth end and an individual electrode which is included in the plurality of individual electrodes and which is closest to the fourth end in the second direction; a second extending portion extending in the second direction from the first extending portion toward the third end; a plurality of first projecting portions each of which extends in the first direction from the second extending portion toward the first end or the second end, at least a portion of each of the plurality of first projecting portions overlapping, in the stacking direction, with the individual electrodes constructing the first individual electrode row; a third extending portion which is arranged, in the first direction, between the second extending portion and the second end and which extends in the second direction from the first extending portion toward the third end; and a plurality of second projecting portions each of which extends in the first direction from the third extending portion toward the first end or the second end, at least a portion of each of the plurality of second projecting portions overlapping, in the stacking direction, with the individual electrodes constructing the second individual electrode row. The bypass trace extends in the first direction between the fourth end and the individual electrode which is closest to the fourth end in the second direction, at least a portion of the bypass trace overlapping, in the stacking direction, with the first extending portion. The piezoelectric body includes: a first through hole extending in the stacking direction between the bypass trace and the first extending portion, and a second through hole extending in the stacking direction between the bypass trace and the first extending portion. The bypass trace and the first extending portion are electrically connected to each other by a conductive material arranged in the first through hole and the second through hole.

According to this configuration of the present disclosure, the bypass trace and the first extending portion of the common electrode are connected to each other by the conductive material arranged in the first through hole and the second through hole, thereby conducting the bypass trace and the first extending portion of the common electrode at least at the two locations. Accordingly, even if such a case is provided that, for example, a sufficient amount of the conductive material is not charged in one through hole of the first and second through holes, which in turn causes any electric disconnection in the one through hole; it is possible to easily supply the electric charge, via the other of the first and second through holes, to the location, of the common electrode, at which the electric charge has been supplied via the one through hole which is disconnected. Accordingly, it is possible to improve the reliability in electrical connection between the bypass trace and the common electrode.

BRIEF DESCRIPTION OF THE DRAWINGS

FIGS. 4A and 4B are schematic cross-sectional views of the ink-jet head according to the embodiment, wherein FIG. 4A is a schematic cross-sectional view in a scanning direction, whereas FIG. 4B is a schematic cross-sectional view in a conveyance direction.

DESCRIPTION OF THE EMBODIMENT

<Overall Configuration of Printer>

Figure 1:
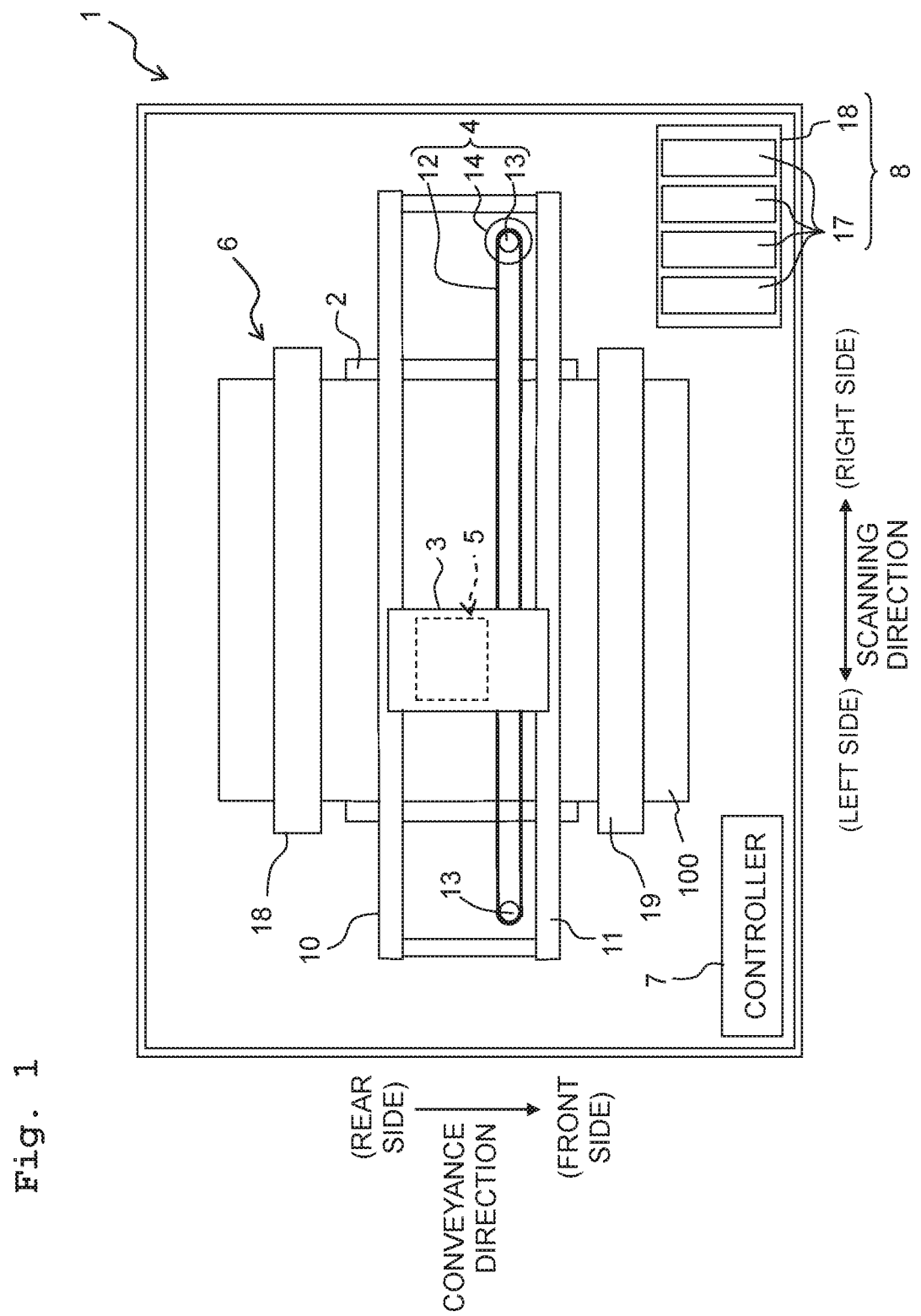
FIG. 1 is a plan view schematically showing an ink-jet printer 1 according to an embodiment of the present disclosure.

An embodiment of the present invention will be explained below. As depicted in FIG. 1, an ink-jet printer 1 includes a platen 2, a carriage 3, a carriage driving mechanism 4, an ink-jet head 5, a conveyance mechanism 6, a controller 7, and an ink supply unit 8.

Recording paper (recording paper sheet or recording sheet) 100, as a recording medium, is placed or carried on the upper surface of the platen 2. The carriage 3 is configured to be reciprocatingly movable, by the carriage driving mechanism 4, in a left/right direction (hereinafter also referred to as a "scanning direction") along two guide rails 10 and 11 in an area facing the platen 2. The carriage driving mechanism 4 includes a belt 12, a carriage driving motor 14, and two rollers 13 arranged respectively at the both sides in the scanning direction of the platen 2 so as to interpose the platen 2 therebetween. The belt 12 is linked to (connected to) the carriage 3. The belt 12 is stretched on and across the two rollers 13 which are arranged apart in the scanning direction, to thereby form, as viewed from thereabove, an elliptic ring elongated in the scanning direction. As depicted in FIG. 1, a roller 13 which is included in the two rollers 13 and is arranged on the right side (right roller 13) is linked to the rotary shaft of the carriage driving motor 14. By rotating the carriage driving motor 14, it is possible to move the belt 12 around the two rollers 13. Along with this, it is possible to reciprocatingly move the carriage 3 linked with the belt 12 in the scanning direction.

The ink-jet head 5 is attached to the carriage 3 and is movable reciprocatingly in the scanning direction together with the carriage 3. The ink supply unit 8 includes four ink cartridges 17 respectively retaining inks of four colors (black, yellow, cyan, and magenta), a cartridges holder 18 in which the four ink cartridges 17 are installed, and tubes which are not illustrated in the drawings. The ink-jet head 5 is connected with the four ink cartridges 17 through the non-illustrated tubes. By virtue of this, the four color inks are supplied to the ink-jet head 5 from the ink supply unit 8.

A plurality of nozzles 23 are formed in the ink-jet head 5 (see FIG. 3), in the lower surface thereof (the surface on the far side of the sheet surface of FIG. 1). The plurality of nozzles 23 discharge or jet the inks supplied from the ink cartridges 17 toward the recording paper 100 placed or carried on the platen 2.

The conveyance mechanism 6 has two conveyance rollers 18 and 19 arranged to interpose the platen 2 in a front/rear direction. The conveyance mechanism 6 conveys the recording paper 100 placed on the platen 2 frontward (hereinafter also referred to as a "conveyance direction"), by using the two conveyance rollers 18 and 19.

The controller 7 includes a ROM (Read Only Memory), a RAM (Random Access Memory), an ASIC (Application Specific Integrated Circuit) including a control circuit, etc. The controller 7 causes the ASIC to execute various kinds of processing such as printing on the recording paper 100, etc., according to programs stored in the ROM. For example, in a printing process, the controller 7 controls the ink-jet head 5, the carriage driving motor 14, etc., so as to print an image on the recording paper 100, based on a print command inputted from an external device such as a PC, etc. Specifically, the controller 7 alternately executes an ink-jet operation for jetting or discharging the ink(s) while moving the ink-jet head 5 in the scanning direction together with the carriage 3, and a conveyance operation for causing the conveyance rollers 18 and 19 to convey the recording paper 100 by a predetermined amount (distance) in the conveyance direction.

Figure 2:
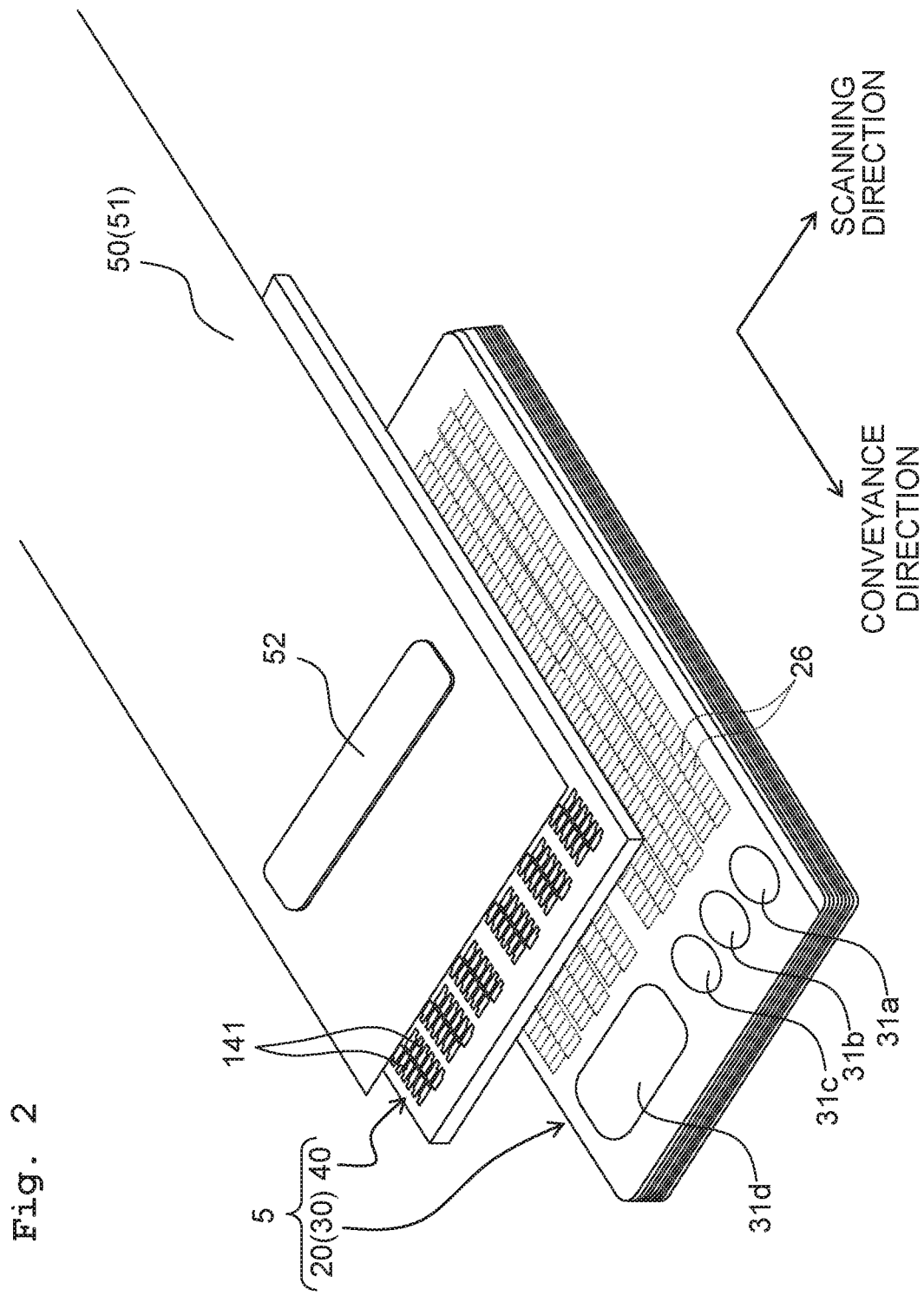
FIG. 2 is a schematic view of an ink-jet head 5 and a trace member 50 according to the embodiment.
Figure 3:
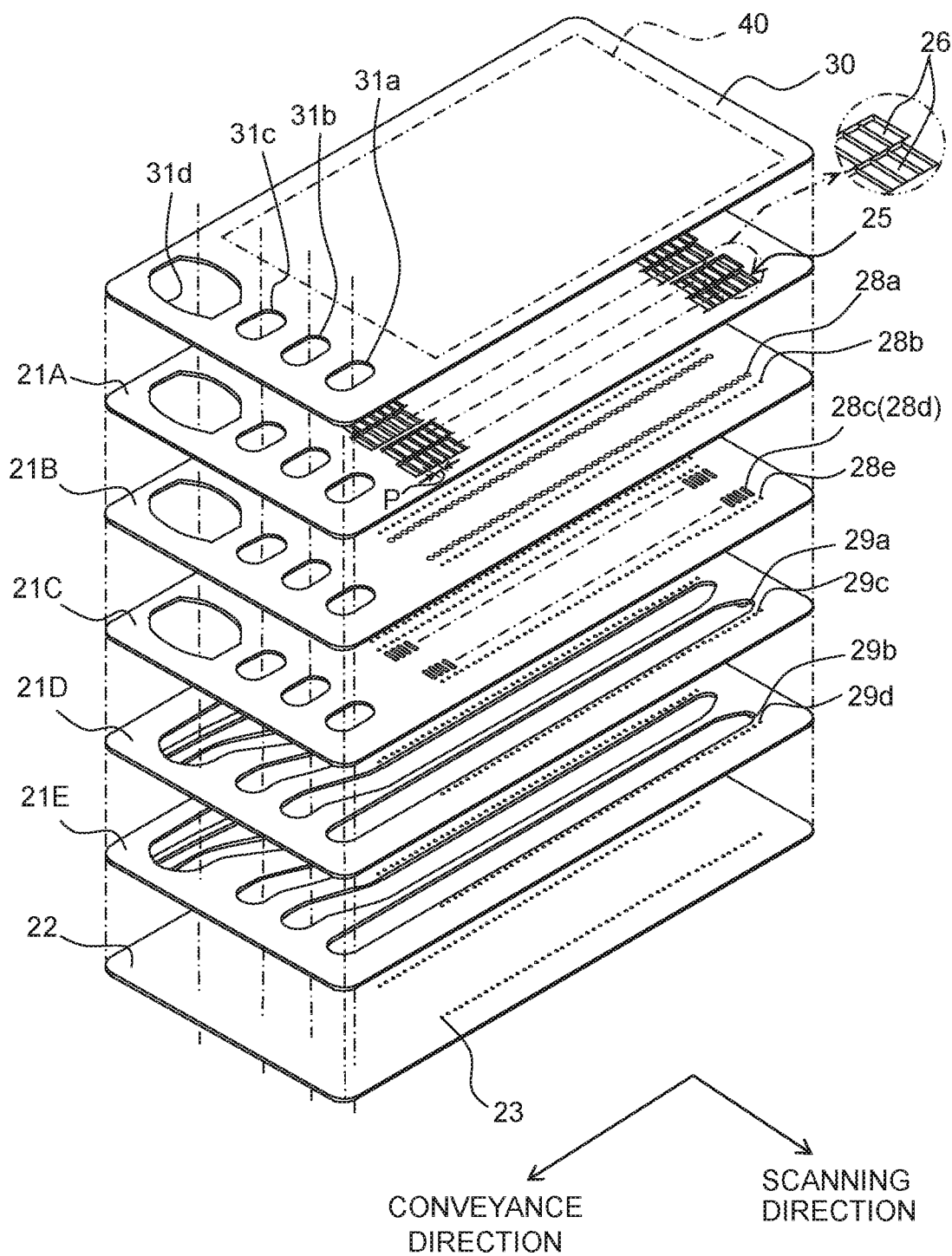
FIG. 3 is a schematic exploded view of a stacked body (layered body) according to the embodiment.

The ink-jet head 5 mainly includes a flow channel unit 20, a vibration plate 30, a piezoelectric body 40, and a trace member 50 (see FIG. 2). As depicted in FIGS. 2 and 3, the flow channel unit 20 includes a nozzle plate 22 and five metallic plates 21A to 21E. Further, the vibration plate 30 is joined onto the metallic plate 21A of the flow channel unit 20. In the following explanation, the combination of the flow channel unit 20 and the vibration plate 30 will be referred to as a stacked body (layered body) 60. That is, the stacked body 60 is, as depicted in FIG. 3, a body or member having the vibration plate 30, the five metallic plates 21A to 21E and the nozzle plate 22 which are stacked in this order and are joined together. In the following explanation, a direction in which these plates are stacked in the stacked body 60 will be referred to as a "stacking direction".

The vibration plate 30 is a metallic plate having a substantially rectangular shape which is elongated in the conveyance direction. Note that each of the metallic plates 21A to 21E and the nozzle plate 22 is also a plate having a substantially rectangular shape and a planar shape similar to that of the vibration plate 30. As depicted in FIGS. 2 and 3, four openings 31a to 31d, as ink supply ports for supplying the inks to manifolds (which will be described later on), are formed in an end portion of the vibration plate 30 in the conveyance direction. The four openings 31a to 31d are arranged side by side (aligned) in the scanning direction (the left/right direction). The opening 31a is the ink supply port for the yellow ink, the opening 31b is the ink supply port for the magenta ink, the opening 31c is the ink supply port for the cyan ink, and the opening 31d is the ink supply port for the black ink. There are three manifolds for the black ink, and the opening 31d is the supply port for supplying the black ink to the three manifolds. On the other hand, there is one manifold for each of the color inks (for each of the cyan, magenta and yellow inks), and the openings 31a to 31c are supply ports for supplying the three color inks to the manifolds corresponding thereto, respectively. Therefore, the opening 31d has a larger area than the area of each of the openings 31a to 31c.

The plate 21A is a metallic plate in which openings which function as a plurality of pressure chambers 26 are formed regularly. Further, in the plate 21A, other openings are formed respectively in positions at which each of the openings overlaps with one of the four openings 31a to 31d of the vibration plate 30. The plurality of pressure chambers 26 are aligned (arranged) in the conveyance direction at an arrangement pitch P so as to form a pressure chamber row 25; such a pressure chamber row 25 is provided as twelve pressure chamber rows 25. The twelve pressure chamber rows 25 are arranged side by side in the scanning direction (the left/right direction).

Among the twelve pressure chamber rows 25, six pressure chamber rows 25 are used for the color inks, while the other six pressure chamber rows 25 are used for the black ink. As depicted in FIG. 2, the six pressure chamber rows 25 for the black ink are arranged side by side with respect to the opening 31d in the conveyance direction. The six pressure chamber rows 25 for the color inks have two pressure chamber rows 25 for the cyan ink, two pressure chamber rows 25 for the magenta ink, and two pressure chamber rows 25 for the yellow ink. The two pressure chamber rows 25 for the cyan ink are arranged side by side with respect to the opening 31c in the conveyance direction. The two pressure chamber rows 25 for the magenta ink are arranged side by side with respect to the opening 31b in the conveyance direction. The two pressure chamber rows 25 for the yellow ink are arranged side by side with respect to the opening 31a in the conveyance direction.

Between the two pressure chamber rows 25 for the cyan ink, the pressure chambers 26 are positioned to be shifted with respect to one another in the conveyance direction by half the arrangement pitch P (P/2) of the respective pressure chamber rows 25. This similarly applies also to the two pressure chamber rows 25 for the magenta ink, and to the two pressure chamber rows 25 for the yellow ink. Although not clearly depicted in FIG. 2, the six pressure chamber rows 25 for the black ink are positioned to be shifted with respect to one another in the conveyance direction by one sixth (⅙) the arrangement pitch P (P/6) of the respective pressure chamber rows 25.

The plate 21B has communication holes 28a which are formed in the plate 21B and which form flow channels laid from manifolds 27 (common ink chambers; to be described later on) to the respective pressure chambers 26, and communication holes 28b which are formed in the plate 21B and which form flow channels laid from the respective pressure chambers 26 to respective nozzles 23 (to be described later on). In the upper surface of the plate 21C, communication holes 28c are formed as recesses for communications between the pressure chambers 26 and the manifolds 27. Further, the plate 21C has communication holes 28d which are formed in the plate 21C and which form flow channels laid from the manifolds 27 to the pressure chambers 26, and communication holes 28e which are formed in the plate 21C and which form flow channels laid from the pressure chambers 26 to the nozzles 23. Further, openings are formed in each of the plates 21B and 21C, at positions or locations thereof at which the openings overlap respectively with the four openings 31a to 31d of the vibration plate 30. Further, the plates 21D and 21E have communication holes 29a and 29b which are formed in the plates 21D and 21E, respectively, and which form the manifolds 27, and communication holes 29c and 29d which are formed in the plates 21D and 21E, respectively, and which form flow channels laid from the pressure chambers 26 to the nozzles 23.

The nozzle plate 22 is made of a synthetic resin (for example, polyimide resin) wherein the nozzles 23 are formed to correspond respectively to the pressure chambers 26 formed in the plate 21A.

By stacking and joining the vibration plate 30, the plates 21A to 21E and the nozzle plate 22, a plurality of flow channels from the manifolds to the nozzles 23 via the pressure chambers 26 are formed as depicted in FIGS. 4A and 4B. At the same time, ink supply flow channels for supplying the inks to the manifolds 27 are also formed.

Since the vibration plate 30 and the plates 21A to 21E are metallic plates, it is possible to join the above-mentioned plates by means of metallic diffusion bonding or junction. Further, since the nozzle plate 22 is made of resin, the nozzle plate 22 is joined to the plate 21E with an adhesive, etc., but not by the metallic diffusion junction. Note that the nozzle plate 22 may be a metallic plate; in such a case, it is possible to join the nozzle plate 22 with the plates 30 and 21A to 21E in the same manner, namely by means of metallic diffusion junction, as the joining of the plates 30 and 21A to 21E. Alternatively, all the plates may be joined with an adhesive, etc.

<Piezoelectric Body 40>

As depicted in FIGS. 2 and 3, for example, the piezoelectric body 40 is arranged on the vibration plate 30. The piezoelectric body 40 has an approximately rectangular planar shape. As depicted in FIGS. 4A and 4B, the piezoelectric body 40 is formed with a plurality of piezoelectric elements 401. The plurality of piezoelectric elements 401 are provided to correspond respectively to the plurality of pressure chambers 26. Each of the piezoelectric elements 401 cooperates with the vibration plate 30 so as to change the volume of one of the plurality of pressure chambers 26 corresponding thereto. With this, each of the piezoelectric elements 401 cooperates with the vibration plate 30 so as to apply a pressure to the ink in one of the plurality of pressure chambers 26 corresponding thereto, thereby providing the ink with energy for jetting the ink from one of the plurality of nozzles 23 communicating with one of the plurality of pressure chambers 26 corresponding thereto.

In the following, the configuration of the piezoelectric body 40 will be explained. As depicted in FIGS. 4A and 4B, the piezoelectric body 40 has three piezoelectric layers (an upper piezoelectric layer 140, an intermediate piezoelectric layer 240, and a lower piezoelectric layer 340), individual electrodes (upper electrodes) 141, an intermediate common electrode (intermediate electrode) 241, and a lower common electrode (lower electrode) 341. The lower piezoelectric layer 340, the intermediate piezoelectric layer 240 and the upper piezoelectric layer 140 are stacked on the vibration plate 30 in the above order. The three piezoelectric layers 140, 240, and 340 are formed of lead zirconate titanate (PZT) which is a mixed crystal of lead titanate and lead zirconate. Alternatively, the three piezoelectric layers 140, 240, and 340 may be formed of a non-lead based piezoelectric material which does not contain lead. The lower common electrode 341 is arranged on the upper surface of the lower piezoelectric layer 340, the intermediate common electrode 241 is arranged on the upper surface of the intermediate piezoelectric layer 240, and the individual electrodes 141, conductive layers 160, 165, etc., are arranged on the upper surface of the upper piezoelectric layer 140.

In the following explanation, the two opposite ends (both ends) in the scanning direction of the upper piezoelectric layer 140 will be referred to as an end portion 140L and an end portion 140R, whereas the two opposite ends (both ends) in the conveyance direction of the upper piezoelectric layer 140 will be referred to as an end portion 140U and an end portion 140D (see FIG. 5). The both ends of the intermediate piezoelectric layer 240 in the scanning direction will be referred to as an end portion 240L and an end portion 240R, while the both ends of the intermediate piezoelectric layer 240 in the conveyance direction will be referred to as an end portion 240U and an end portion 240D (see FIG. 7). The both ends of the lower piezoelectric layer 340 in the scanning direction will be referred to as an end portion 340L and an end portion 340R, while the both ends of the lower piezoelectric layer 340 in the conveyance direction will be referred to as an end portion 340U and an end portion 340D (see FIG. 8).

Figure 5:
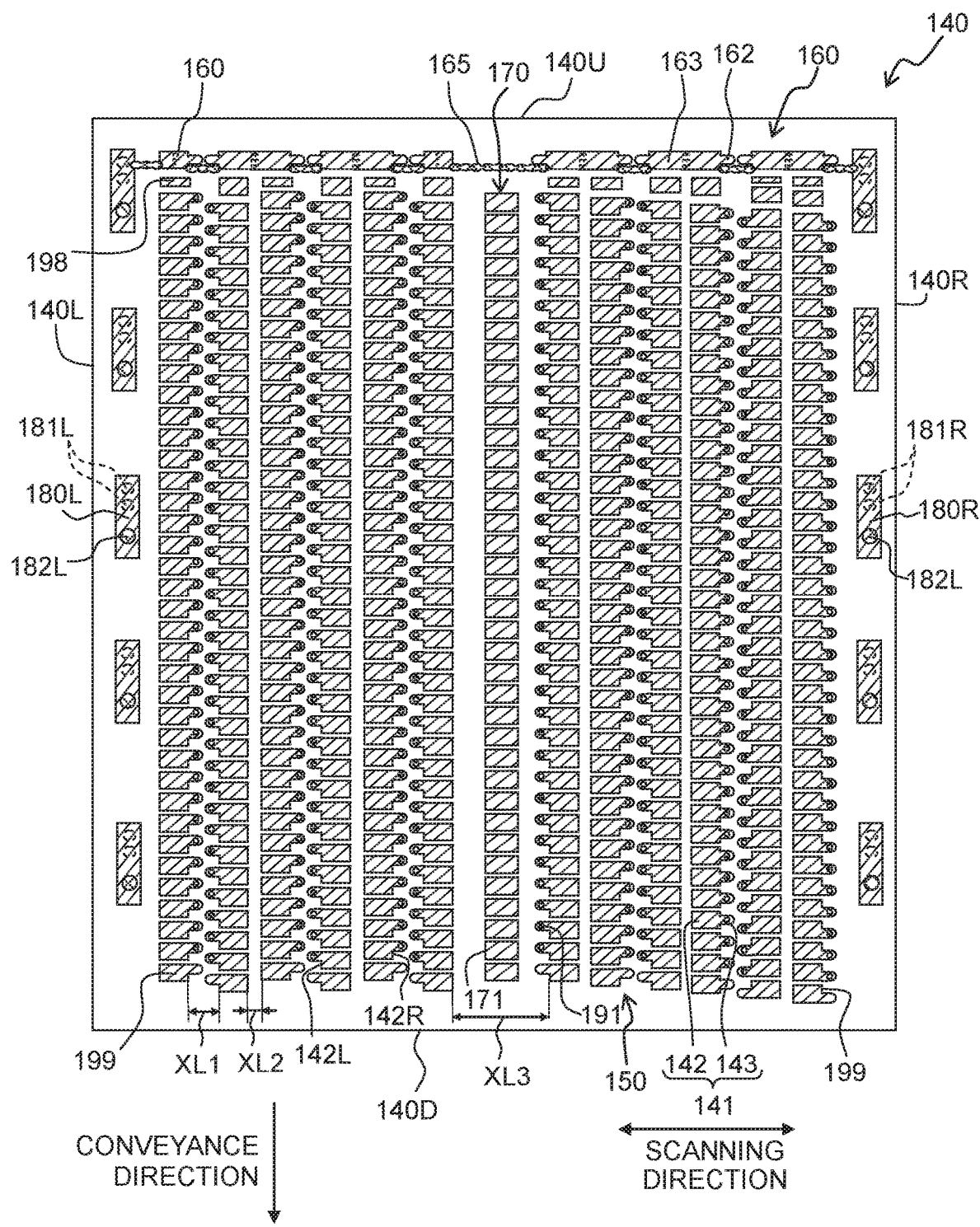
FIG. 5 is a top view of an upper piezoelectric layer 140 according to the embodiment.
Figure 7:
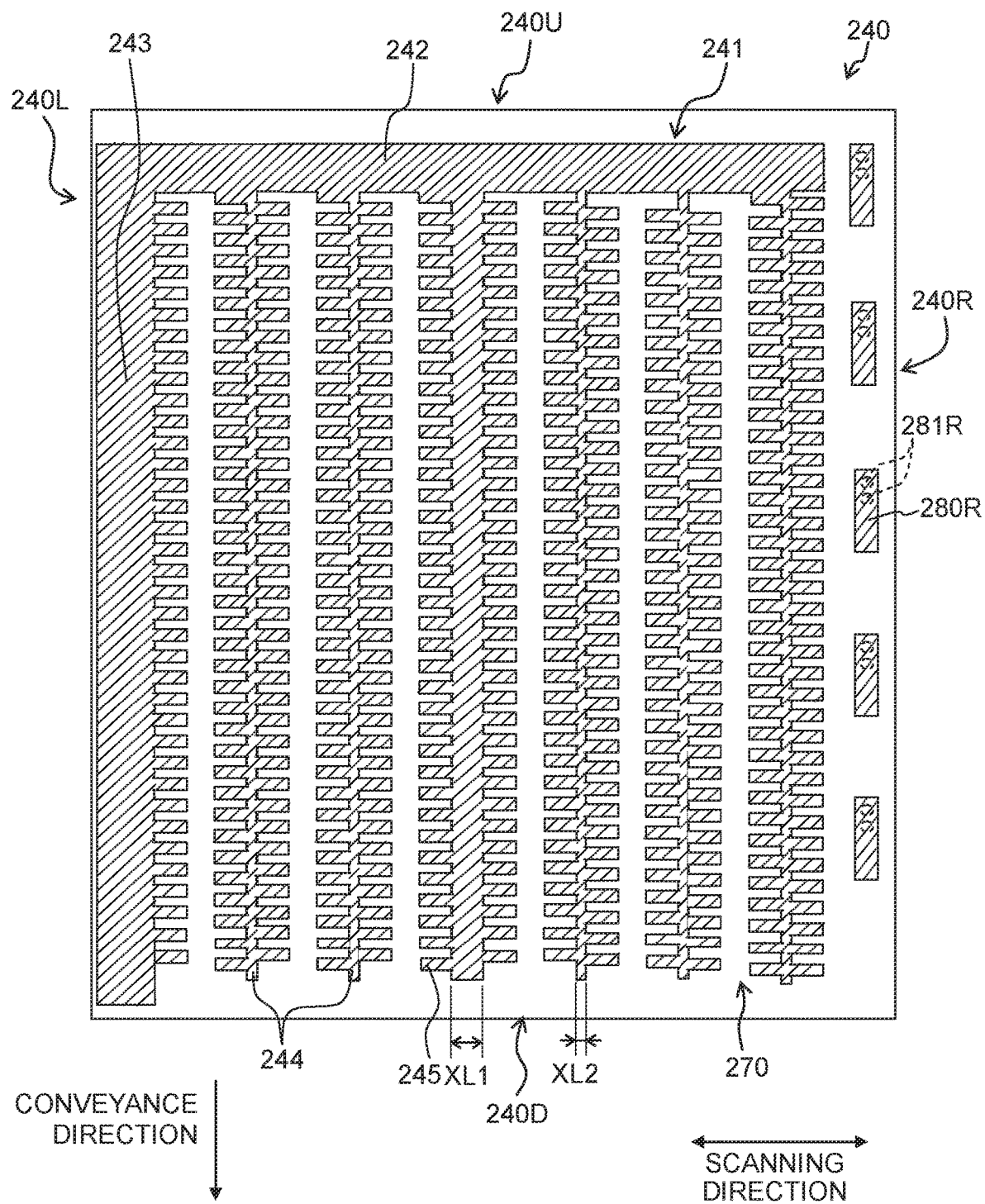
FIG. 7 is a top view of an intermediate piezoelectric layer 240 according to the embodiment.

As depicted in FIG. 5, five terminals 180R are formed in the end portion 140R, of the upper piezoelectric layer 140, in the scanning direction. As depicted in FIG. 7, five terminals 280R are formed in the intermediate piezoelectric layer 240, at positions at which the five terminals 280R overlap respectively with the five terminals 180R in the stacking direction. The terminals 180R and 280R are formed of a conductive material (silver palladium (AgPd)) which is a same material as that forming individual electrodes 141 (to be described later on). Further, two through holes 181R are formed in the upper piezoelectric layer 140 at positions at each of which the two through holes 181R overlap with one of the five terminals 280R. Two through holes 281R are formed in the intermediate piezoelectric layer 240 at positions at each of which the two through holes 281R overlap with one of the five terminals 280R. Note that the through holes 181R and the through holes 281R are positioned to be continued relative to one another in the stacking direction. Two of the through holes 181R and two of the through holes 281R which are continued form (define) through holes penetrating the upper piezoelectric layer 140 and the intermediate piezoelectric layer 240. A conductive material (silver palladium (AgPd)) which is a same material as that forming the terminals 180R and 280R is filled (charged) in the inside of each of the through holes 181R and 281R. As will be described later on, a step of filling the conductive material in the inside of each of the through holes 181R and 281R and a step of forming the terminals 180R and 280R by a method such as the screen printing, etc., are executed as a series of steps. The conductive material filled in the inside of the through holes 281R is conducted with the lower common electrode 341 (extending portion 343, to be described later on; see FIG. 8). Namely, the lower common electrode 341 is lead up to the terminals 180R on the upper surface of the upper piezoelectric layer 140 via the conductive material in the inside of each of through holes 281R and 181R.

As depicted in FIG. 5, five terminals 180L are formed in the end portion 140L, of the upper piezoelectric layer 140, in the scanning direction. The terminals 180L are formed of a conductive material (silver palladium (AgPd)) which is a same material as that forming the individual electrodes 141 (to be described later on) and the terminals 180R. Further, two through holes 181L are formed in the upper piezoelectric layer 140 at positions at each of which the two through holes 181L overlap with one of the five terminals 180L. A conductive material (silver palladium (AgPd)) which is a same material as that forming the terminals 180L is filled (charged) in the inside of each of the through holes 181L. The conductive material filled in the inside of the through holes 181L is conducted with the intermediate common electrode 241 (extending portion 243, to be described later on; see FIG. 7). Namely, the intermediate common electrode 241 is lead up to the terminals 180L on the upper surface of the upper piezoelectric layer 140 via the conductive material in the inside of each of through holes 181L.

Bumps 182L, 182R connectable to non-illustrated terminals of a COF 51 (to be described later on) are formed respectively in the terminals 181L, 180R. By allowing the bumps 182L, 182R to be connected to the COF 51, it is possible to apply a predetermined potential (for example, 0 (zero) V) to the intermediate common electrode 241 and the lower common electrode 341 from a driver IC 58 via the COF 51.

<Individual Electrodes 141>

As depicted in FIGS. 4A and 4B, a plurality of individual electrodes 141 are formed in the upper piezoelectric layer 140 at positions which correspond respectively to the plurality of pressure chambers 26. The individual electrodes 141 are formed of a conductive material such as, for example, silver palladium (AgPd), platinum (Pt), iridium (Ir), etc. The individual electrodes 141 of the present embodiment are formed of the silver palladium (AgPd). As depicted in FIG. 5, twelve individual electrode rows 150 are formed to correspond to the twelve pressure chamber rows 25. The twelve individual electrode rows 150 are arranged side by side in the scanning direction. Each of the individual electrode rows 150 includes 37 pieces of the individual electrode 141 aligned (arranged) in the conveyance direction at a predetermined pitch P. Note that in the following explanation, an individual electrode row 150 which is included in the twelve individual electrode rows 150 and which is located in a n-th location in the scanning direction numbered from another individual electrode row 150 which is the closest, in the scanning direction, to the end portion 140L of the upper piezoelectric layer 140 is referred to simply as a "n-th" individual electrode row 150 from the left. This is similarly applicable also regarding the intermediate piezoelectric layer 240 and the lower piezoelectric layer 340; a certain portion or part (element) which is included in a plurality of portions or parts (elements) and which is located in a n-th location in the scanning direction numbered from another part of portion (element) which is the closest, in the scanning direction, to the end portion 240L (see FIG. 7) of the intermediate piezoelectric layer 240, or the end portion 340L (see FIG. 8) of the lower piezoelectric layer 340 is referred to simply as a "n-th" portion or part (element) from the left. A first individual electrode row 150 from the left and a second individual electrode row 150 from the left are positioned (arranged) to be shifted from each other in the conveyance direction by half the arrangement pitch P (P/2). Similarly, a third individual electrode row 150 from the left and a fourth individual electrode row 150 from the left are positioned (arranged) to be shifted from each other in the conveyance direction by half the arrangement pitch P (P/2); and a fifth individual electrode row 150 from the left and a sixth individual electrode row 150 from the left are positioned (arranged) to be shifted from each other in the conveyance direction by half the arrangement pitch P (P/2). Further, seventh and eighth individual electrode rows 150 from the left are positioned to be shifted from each other in the conveyance direction by ⅙ the arrangement pitch P. Similarly, the eighth and ninth individual electrode rows 150 from the left are positioned to be shifted from each other in the conveyance direction by ⅙ the arrangement pitch P; the ninth and tenth individual electrode rows 150 from the left are positioned to be shifted from each other in the conveyance direction by ⅙ the arrangement pitch P; the tenth and eleventh individual electrode rows 150 from the left are positioned to be shifted from each other in the conveyance direction by ⅙ the arrangement pitch P; and the eleventh and twelfth individual electrode rows 150 from the left are positioned to be shifted from each other in the conveyance direction by ⅙ the arrangement pitch P.

Among the twelve individual electrode rows 150, first six pairs of the individual electrode rows 150 from the left, namely a pair of the first and second, a pair of third and fourth, and a pair of fifth and sixth individual electrode rows 150 from the left correspond respectively to the pressure chamber rows 25 for the cyan ink, the pressure chamber rows 25 for the magenta ink, and the pressure chamber rows 25 for the yellow ink. Further, another six pairs of the individual electrode rows 150 from the left, namely a pair of the seventh and eighth, a pair of ninth and tenth, and a pair of eleventh and twelfth individual electrode rows 150 from the left correspond to the pressure chamber rows 25 for the black ink.

Figure 6A:
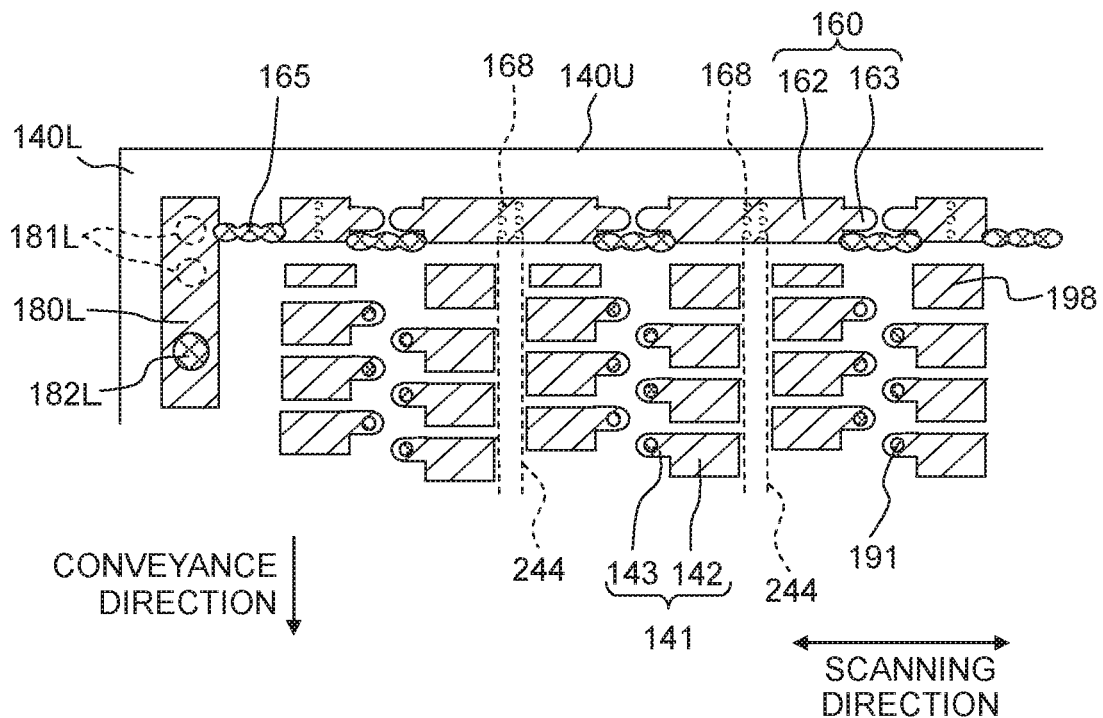
FIG. 6A is an explanatory view enlarging a part of the upper surface of the upper piezoelectric layer 140 according to the embodiment.

As depicted in FIGS. 5 and 6A, each of the individual electrodes 141 has a wide-width portion 142 (an example of the first part) having a rectangular planar shape, and a narrow-width portion 143 (an example of the second part) extending from the wide-width portion 142 leftward or rightward in the left/right direction (the scanning direction). Each of the narrow-width portions 143 is formed with a bump 191 which is to be joined electrically with an non-illustrated contact point provided in the FPC 51 of a trace member 50 (to be described later on). As depicted in FIG. 5, in the individual electrodes 141 forming the first, third, fifth, eighth, tenth, and twelfth individual electrode rows 150 from the left among the twelve individual electrode rows 150, the narrow-width portions 143 extend in the scanning direction respectively from end portions 142R, of the wide-width portions 142, in the scanning direction toward the end portion 140R of the upper piezoelectric layer 140. In the individual electrodes 141 forming the second, fourth, sixth, seventh, ninth and eleventh individual electrode rows 150 from the left among the twelve individual electrode rows 150, the narrow-width portions 143 extend in the scanning direction respectively from end portions 142L, of the wide-width portions 142, in the scanning direction toward the end portion 140L of the upper piezoelectric layer 140. Note that each of the narrow-width portions 143 extends in the scanning direction, at the side opposite to (the far side from) the nozzle formed in one of the pressure chambers 26 corresponding thereto (see FIG. 4A). That is, in the pressure chambers 26 forming the first, third, fifth, eighth, tenth, and twelfth pressure chamber rows 25 from the left, the nozzles 23 of the respective pressure chambers 26 are formed in positions closer to the end portions 140L of the upper piezoelectric layer 140, than to the center in the scanning direction of each of the pressure chamber 26. In the pressure chambers 26 forming the second, fourth, sixth, seventh, ninth and eleventh pressure chamber rows 25 from the left, the nozzles 23 of the respective pressure chambers 26 are formed in positions closer to the end portions 140R of the upper piezoelectric layer 140, than to the center in the scanning direction of each of the pressure chamber 26.

Among the individual electrode rows 150 adjacent to each other in the scanning direction, (1) the first individual electrode row 150 and the second individual electrode row 150 from the left; (2) the third individual electrode row 150 and the fourth individual electrode row 150 from the left; (3) the fifth individual electrode row 150 and the sixth individual electrode row 150 from the left; (4) the eighth individual electrode row 150 and the ninth individual electrode row 150 from the left; and (5) the tenth individual electrode row 150 and the eleventh individual electrode row 150 from the left, are arranged such that the narrow-width portions 143 of the individual electrodes 141 forming the individual electrode rows 150 respectively face each other in the scanning direction. Therefore, an interval (XL1) in the scanning direction between the wide-width portions 142 of the individual electrodes 141 forming two individual electrode rows 150 in which the narrow-width portions 143 thereof face each other in the scanning direction is larger than an interval (XL2) in the scanning direction of the wide-width portions 142 of the individual electrodes 141 forming two individual electrode rows 150 in which the narrow-width portions 143 thereof do not face each other in the scanning direction. Note that an interval (XL3) in the scanning direction between the wide-width portions 142 of the individual electrodes 141 forming the sixth individual electrode row 150 and the seventh individual electrode row 150 from the left is further larger than the interval XL1 and the interval XL2. This is because the first to the sixth individual electrode rows 150 from the left correspond to the pressure chamber rows 25 for the color inks, whereas the seventh to the twelfth individual electrode rows 150 from the left correspond to the pressure chamber rows 25 for the black ink.

A dummy electrode row 170, constructed of dummy electrodes 171 which are aligned in the conveyance direction at the arrangement pitch P same as that for the individual electrodes 141, is formed between the sixth individual electrode row 150 from the left and the seventh individual electrode row 150 from the left in the scanning direction. The dummy electrodes 171 are formed to correspond to the wide-width portions 142 of the individual electrodes 141, and have the shape and size which are substantially same as those of the wide-width portions 142 of the individual electrodes 141. Note that since the driver IC 58 does not apply the potential to the dummy electrodes 171, the dummy electrodes 171 are not provided with parts or portions corresponding to the narrow-width portions 143 of the individual electrodes 141. The extent of the interval in the scanning direction between the wide-width portion 142 of each of the individual electrodes 141 forming the sixth individual electrode row 150 from the left and one of the dummy electrodes 171, and the extent of the interval in the scanning direction between the wide-width portion 142 of each of the individual electrodes 141 forming the seventh individual electrode row 150 from the left and one of the dummy electrodes 171 are both made to be the interval XL1.

<Conductive Layer 160>

As depicted in FIG. 5, seven pieces of the conductive layer 160 are formed in a location between the end portion 140U of the upper piezoelectric layer 140 and individual electrodes 141 which are included respectively in the individual electrode rows 150 and which are (arranged) closest to the end portion 140U. The seven conductive layers 160 are formed at a position or location at which the conductive layers 160 are overlapped, in the stacking direction, with the extending portion 242 of the intermediate common electrode 241. Note that the conductive layers 160 are formed of a same conductive material which is same as that forming the individual electrodes 141 (silver palladium (AgPd)). As depicted in FIGS. 5A and 6, the seven conductive layers 160 are arranged to be aligned in a row in the scanning direction. The positions in the conveyance direction of the seven conductive layers 160 are all the same. In other words, the distances in the conveyance direction between the end portion 140U of the upper piezoelectric layer 140 and the respective conductive layers 160 are all the same.

The position in the scanning direction of a first conductive layer 160 from the left is same as the position in the scanning direction of the first individual electrode row 150 from the left. The position in the scanning direction of a second conductive layer 160 from the left is same as the positions in the scanning direction of the second and third individual electrode rows 150 from the left. The position in the scanning direction of a third conductive layer 160 from the left is same as the positions in the scanning direction of the fourth and fifth individual electrode rows 150 from the left. The position in the scanning direction of a fourth conductive layer 160 from the left is same as the position in the scanning direction of the sixth individual electrode row 150 from the left. The position in the scanning direction of a fifth conductive layer 160 from the left is same as the positions in the scanning direction of the seventh and eighth individual electrode rows 150 from the left. The position in the scanning direction of a sixth conductive layer 160 from the left is same as the positions in the scanning direction of the ninth and tenth individual electrode rows 150 from the left. The position in the scanning direction of a seventh conductive layer 160 from the left is same as the positions in the scanning direction of the eleventh and twelfth individual electrode rows 150 from the left.

The shape of the first and fourth conductive layers 160 from the left is substantially same as the shape of each of the individual electrodes 141. Similarly to the individual electrode 141, each of the first and fourth conductive layers 160 from the left has a wide-width portion 162 having a rectangular planar shape, and a narrow-width portion 163 extending from the wide-width portion 162 in either one direction (leftward or rightward) in the left-right direction (scanning direction). The length in the scanning direction of the wide-width portion 162 of each of the first and fourth conductive layers 160 from the left is same as the length in the scanning direction of the wide-width portion 142 of the individual electrode 141. The length in the conveyance direction of the wide-width portion 162 of each of the first and fourth conductive layers 160 from the left is same as the length in the conveyance direction of the wide-width portion 142 of the individual electrode 141. The shapes of the second, third, fifth, sixth and seventh conductive layers 160 from the left are all the same, each having a wide-width portion 162 having a rectangular planar shape, and two narrow-width portions 163 extending from the wide-width portion 162 leftward and rightward, respectively, in the left-right direction (scanning direction). As depicted in FIG. 5, the length in the scanning direction of the wide-width portion 162 of each of the second, third, fifth, sixth and seventh conductive layers 160 from the left are greater than twice the length in the scanning direction of the wide-width portion 142 of each of the individual electrodes 141. The length in the conveyance direction of the wide-width portion 162 of each of the second, third, fifth, sixth and seventh conductive layers 160 from the left are same as the length in the conveyance direction of the wide-width portion 142 of each of the individual electrodes 141.

<Conductive Layer 165>

As depicted in FIGS. 5 and 6A, a conductive layer 165 is provided between, in the scanning direction, the wide-width portions 162 of two conductive layers 160 which are adjacent in the scanning direction; the conductive layer 165 connects end portions 162L in the conveyance direction of the wide-width portions 162 to each other. Further, a conductive layer 165 is also provided between the first conductive layer 160 from the left and a terminal 180L located closest to the end portion 140U; the conductive layer 165 connects the conductive layer 165 from the left to a terminal 180L located closest to the end portion 140U. The conductive layer 165 is formed of a conductive adhesive such as silver paste, etc., and joined or connected to the COF 51 (see FIG. 10) by a DC joining (to be described later on). As will be described later, the conductive layer 165 is formed by crushing, by the COF 51, a plurality of bumps which are arranged at a predetermined spacing distance, from the upper side thereof, such that a conductive layer 165 in which deformed (crushed) bumps are connected (linked) to one another in a row.

<Through Hole 168>

As depicted in FIGS. 5 and 6A, six through holes 168 are formed in a substantially central portion in the scanning direction of the wide-width portion 162 of the second conductive layer 160 from the left. The six through holes 168 are arranged so as to form two rows arranged side by side in the scanning direction; three through holes 168 are arranged in the conveyance direction in each of the two rows. The positions in the scanning direction of the six through holes 168 are same as the position in the scanning direction of a first extended portion 244 from the left (to be described later on) of the intermediate common electrode 241. Note that in FIG. 6A, the extending portions 244 of the intermediate common electrode 241 are depicted by dotted lines. For simplifying the drawing, the illustration of the extending portions 242 and the projecting portions 245 of the intermediate common electrode 241 are omitted. As depicted in FIG. 6A, the positions in the scanning direction of the six through holes 168 are same as the position in the scanning direction of the extending portion 244. More specifically, the six through holes 168 are positioned, in the scanning direction, in the inside of the extending portion 244. Similarly, six through holes 168 are also formed in the wide-width portion 162 of each of the third, fifth, sixth and seventh conductive layers 160 from the left. The positions of the six through holes 168 formed with respect to any one of the third, fifth, sixth and seventh conductive layers 160 from the left are also same as the position in the scanning direction of the extended portion 244. Further, as depicted in FIG. 6A, three through holes 168 are formed in a substantially central portion in the scanning direction of the wide-width portion 162 of the first conductive layer 160 from the left. Similarly, three through holes 168 are also formed in a substantially central portion in the scanning direction of the wide-width portion 162 of the fourth conductive layer 160 from the left.

An extending portion 242 of the intermediate common electrode 241 is provided in the intermediate piezoelectric layer 240 at a position (location) thereof overlapping with the through holes 168 (see FIG. 7). A conductive material (silver palladium (AgPd)) which is a same material as that forming the conductive layers 160 is filled (charged) in the inside of each of the through holes 168, and the conductive material inside the through holes 168 is conducted with the extending portion 244 of the intermediate common electrode 241. As described above, all the conductive layers 160 are conducted with one another via the conductive layers 165, and are further conducted with a terminal 180L located closest to the end portion 140U. With this, the intermediate common electrode 241 and a terminal 180L located closest to the end portion 140U are conducted with one another, via the conductive material in the inside of the conductive layers 160, 165 and in the inside of the through holes 168.

As described above, the conductive layers 160 formed with the through holes 168 are arranged to be dispersed in a plurality of locations which are apart from one another in the scanning direction. Accordingly, the electrical route from the terminals 180L to the intermediate common electrode 241 is not just one, and the bypass route is also formed. Namely, the conductive layers 160, 165 and the conductive body in the inside of the through holes 168 form a plurality of bypass traces from a terminal 180L located closest to the end portion 140U and reaching up to the intermediate common electrode 241.

Figure 6B:
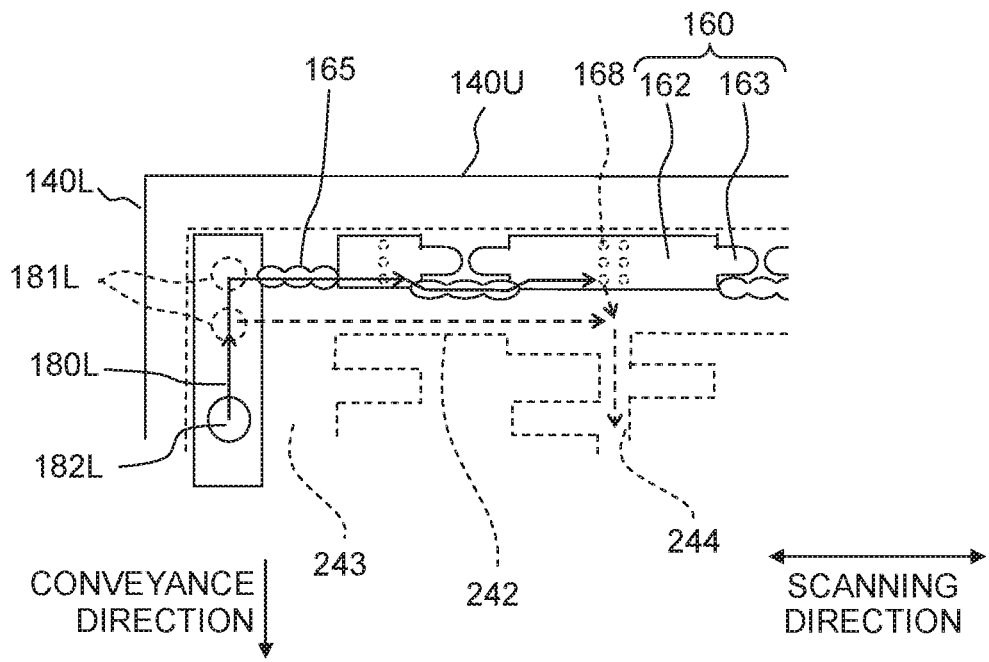
FIG. 6B is a schematic view for explaining the electrical route.

For example, as depicted in FIG. 6B, the charge supplied from the terminal 180L is supplied to the intermediate common electrode 241 via the plurality of electrical routes. Note that in FIG. 6B, the electrical route on the upper surface of the upper piezoelectric layer 140 is indicated by arrows depicted in solid lines, and the electrical route on the upper surface of the intermediate piezoelectric layer 240 is indicated by arrows depicted in broken lines. Further, in FIG. 6B, the illustrations of the individual electrodes 141 and the dummy electrodes 198 are omitted, and a part of the hutching is omitted. As depicted in FIG. 6B, a part of the charge supplied from the terminal 182L passes through one of the two through holes 181L, is supplied to the extended portion 243 of the intermediate common electrode 241, and is supplied further to the first extended portion 244 from the left. Further, another part of the charge supplied from the terminal 182L passes through the first conductive layer 165 from the left, and arrives to the first conductive layer 160 from the left. Then, a part of the charge arrived at the first conductive layer 160 from the left passes through the second conductive layer 165 from the left and arrives at the second conductive layer 160 from the left. A part of the charge arrived at the second conductive layer 160 from the left passes through one of the six through holes 168 formed in the second conductive layer 160 from the left, is supplied to the extending portion 242 of the intermediate common electrode 241, and is supplied to the first extending portion 244 from the left.

As described above, the charge can be supplied, with respect to one piece of the extending portion 244, via the electrical route passing through the upper piezoelectric layer 140 and the electrical route passing through the intermediate electrical layer 240. Note that the electrical route depicted in FIG. 6B is merely an example, and a plurality of electrical routes which are not depicted are present. Further, although not depicted in FIG. 6B, in a case that a large amount of the charge is required in the first extended portion 244 from the left, a part of the charge supplied to another extended portion 244 can be supplied to the first extended portion 244 from the left, via the extended portion 242.

<Dummy Electrodes 198, 199>

As depicted in FIGS. 5 and 6A, dummy electrodes 198 formed of a conductive material which is same as that forming the individual electrodes 141 are arranged, in the conveyance direction, between the conductive layers 160 and the individual electrodes rows 150. Further, as described above, since the individual electrode rows 150 are arranged in the conveyance direction to be shifted from one another, the spacing distance in the conveyance direction between each of the individual electrode rows 150 and one of the conductive layer 160 is made to be different in accordance with each of the individual electrode rows 150. Similarly, the spacing distance in the conveyance direction between the end portion 140D and each of the individual electrode rows 150 is also made to be different in accordance with each of the individual electrode rows 150. The length in the conveyance direction of each of the dummy electrodes 198 is set depending on the spacing distance in the conveyance direction between the conductive layer 160 and the individual electrode row 150. Specifically, the length in the conveyance direction of each of the dummy electrodes 198 is set such that the spacing distance in the conveyance direction between each of the dummy electrodes 198 and the one of the conductive layers 160 and the spacing distance in the conveyance direction between each of the dummy electrodes 198 and the one of the individual electrodes 141 are made to be same as the spacing distance between two individual electrodes 141 which are adjacent in the conveyance direction.

As depicted in FIG. 5, dummy electrodes 199 formed of a conductive material which is same as that forming the individual electrodes 141 are arranged between the end portion 140D and individual electrodes 141 which are included respectively in the individual electrode rows 150 and which are closest to the end portion 140D in the conveyance direction. The shape of the dummy electrodes 199 are same as the shape of the individual electrodes 144.

The length in the conveyance direction of each of the dummy electrodes 199 is set depending on the spacing distance in the conveyance direction between the end portion 140D and the individual electrode row 150. The spacing distance in the conveyance direction between each of the dummy electrodes 199 and the individual electrode 141 which is included in one of the individual electrode rows 150 and which is closest to the end portion 140D is same as the spacing distance between two individual electrodes 141 which are adjacent in the conveyance direction.

By providing the dummy electrodes 198 and 199 as described above, any difference in the characteristics is not caused, in each of the individual electrode rows 150, between individual electrodes 141 which are located at the both ends in the conveyance direction and the remaining individual electrodes 151 different from the individual electrodes on the both ends.

<Intermediate Common Electrode 241>

As depicted in FIGS. 4A and 4B, the intermediate common electrode 241 is formed on the upper surface of the intermediate piezoelectric layer 240. As depicted in FIG. 7, the intermediate common electrode 241 has an extending portion 242 extending in the scanning direction (the left/right direction) to cover an end portion 240U in the conveyance direction of the intermediate piezoelectric layer 240, an extending portion 243 extending in the conveyance direction to cover the end portion 240L in the scanning direction of the intermediate piezoelectric layer 240, six extending portions 244 extending in the conveyance direction from the extending portion 242 toward an end portion 240D in the conveyance direction of the intermediate piezoelectric layer 240, and a plurality of projecting portions 245 which project from each of the extending portions 244 toward the two opposite sides (both sides) in the scanning direction. Further, the plurality of projecting portions 245 also project from the extending portion 243 toward the end portion 240R of the intermediate piezoelectric layer 240.

Figure 9A:
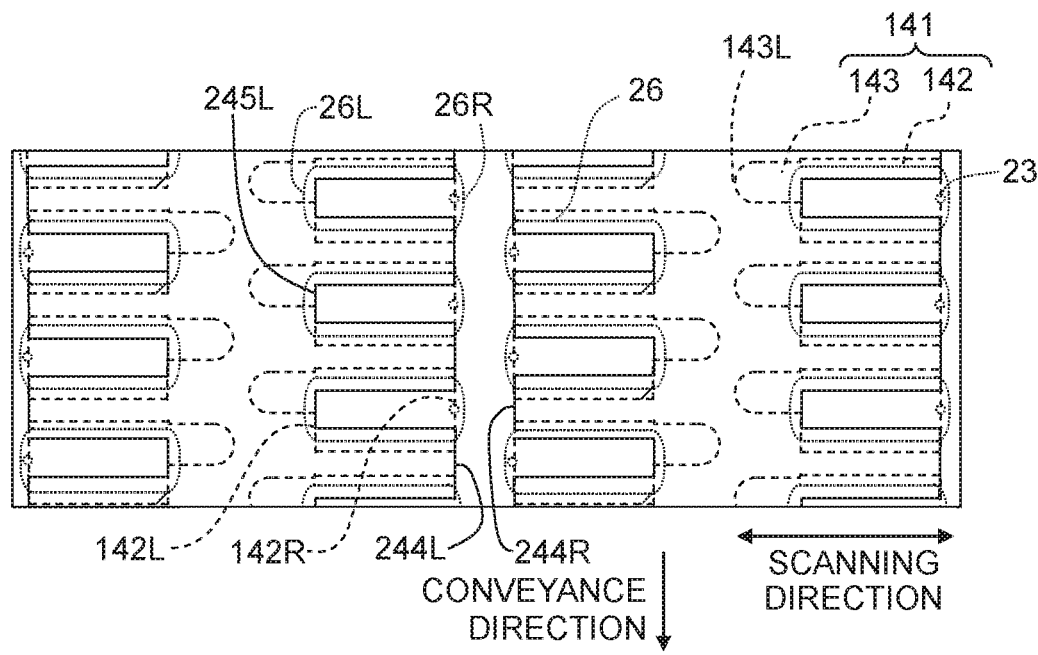
FIG. 9A is a schematic view depicting the overlap of the upper piezoelectric layer 140 and the intermediate piezoelectric layer 240.

The extending portion 242 and the extending portion 243 are arranged at positions, respectively, at which the extending portions 242 and 243 do not overlap, in the stacking direction, with the pressure chambers 26 and the individual electrodes 141. As depicted in FIG. 9A, the extending portions 244 extend in the conveyance direction between the wide-width portions 142 of the individual electrodes 141, forming two individual electrode rows 150 which are adjacent in the scanning direction, such that the extending portions 244 do not overlap in the stacking direction with the wide-width portions 142 of the individual electrodes 141 forming the two adjacent individual electrode rows 150. In FIG. 6, among the six extending portions 244, the first extending portion 244 from the left extends in the conveyance direction to pass through between, in the scanning direction, the wide-width portions 142 forming the second and third individual electrode rows 150 from the left. The second extending portion 244 from the left extends in the conveyance direction to pass through between, in the scanning direction, the wide-width portions 142 forming the fourth and fifth individual electrode rows 150 from the left. The third extending portion 244 from the left extends in the conveyance direction to pass through between, in the scanning direction, the wide-width portions 142 forming the sixth individual electrode row 150 from the left and the dummy electrodes 171 forming the dummy electrode row 170. The fourth extending portion 244 from the left extends in the conveyance direction to pass through between, in the scanning direction, the wide-width portions 142 forming the seventh and eighth individual electrode rows 150 from the left. The fifth extending portion 244 from the left extends in the conveyance direction to pass through between, in the scanning direction, the wide-width portions 142 forming the ninth and tenth individual electrode rows 150 from the left. The sixth extending portion 244 from the left extends in the conveyance direction to pass through between, in the scanning direction, the wide-width portions 142 forming the eleventh and twelfth individual electrode rows 150 from the left.

The third extending portion 244 from the left is positioned at the boundary between the pressure chamber rows 25 for the color inks and the pressure chamber rows 25 for the black ink, with a width greater than that of the remaining five extending portions 244 in accordance with the wider interval between the pressure chamber rows 25 in the scanning direction as described earlier on. The remaining five extending portions 244 have the same width. Note that with respect to the five remaining extending portions 244 which are different from the third extending portions 244 from the left, the individual electrodes 141 forming the two adjacent individual electrode rows 150 which interpose each of the five remaining extending portion 244 in the scanning direction are arranged such that the narrow-width portions 143 belonging to the two individual electrode rows 150 extend toward the opposite side to one another in the scanning direction. That is, with respect to the five remaining extending portions 244 which are different from the third extending portion 244 from the left, the interval or spacing distance in the scanning direction of the wide-width portions 142 of the individual electrodes 141, forming the two adjacent individual electrode rows 150 interposing each of the five remaining extending portion 244 in the scanning direction, is XL2. In accordance with this configuration, the width in the scanning direction of the five remaining extending portions 244, which are different from the third extending portion 244 from the left, is also XL2.

Next, referring to FIG. 9A, an explanation will be made about the positional relationship among the pressure chambers 26, the individual electrodes 141 and the intermediate common electrode 241. In FIG. 9A, although four individual electrode rows arranged side by side in the scanning direction are depicted, the explanation regarding FIG. 9A will be made about the positional relationship while considering, as an example, the individual electrodes 141 included in the second individual electrode row from the left, and the pressure chambers 26 and intermediate common electrode 241 overlapping therewith in the stacking direction. In order that the figure is easily viewed, the intermediate common electrode 241 and the conductive layers 260 formed in the intermediate piezoelectric layer 240 are depicted with solid lines, whereas the pressure chambers 26, the individual electrodes 141, etc., are depicted with dotted lines.

The length in the scanning direction of the pressure chambers 26 is greater (longer) than the length in the scanning direction of the wide-width portions 142 of the individual electrodes 141. Note that the entire length, in the scanning direction, of each of the individual electrodes 141 combining the wide-width portions 142 and the narrow-width portions 143 is greater than the length in the scanning direction of one of the pressure chambers 26. The length in the scanning direction of the projecting portions 245 of the intermediate common electrode 241 is substantially same as the length in the scanning direction of the wide-width portions 142 of the individual electrodes 141.

Each of the nozzles 23 is positioned closer, in the scanning direction, to an end portion 26R than to an end portion 26L of one of the pressure chambers 26. The end portion 26R of each of the pressure chambers 26 is positioned, in the scanning direction, between an end portion 244L and an end portion 244R of one of the extending portions 244. The end portion 26L of each of the pressure chambers 26 is positioned, in the scanning direction, between an end portion 142L of the wide-width portion 142 and an end portion 143L of the narrow-width portion 143 of one of the individual electrodes 141. An end portion 245L in the scanning direction of each of the projecting portion 245 of the intermediate common electrode 241 is arranged at a substantially same position in the scanning direction as the end portion 142L of the wide-width portion 142 of one of the individual electrodes 141. The end portion 142R of the wide-width portion 142 of each of the individual electrodes 141, the end portion 244L of each of the extending portions 244, and each of the nozzles 23 are arranged at a substantially same position in the scanning direction.

Each of the projecting portions 245 of the intermediate common electrode 241, each of the pressure chambers 26 and the wide-width portion 142 of each of the individual electrodes 141 are arranged such that the central positions thereof in the conveyance direction are substantially aligned with one another in the conveyance direction. The length in the conveyance direction of each of the pressure chambers 26 is greater in the conveyance direction than the length in the conveyance direction of one of the projecting portions 245 of the intermediate common electrode 241; the ratio between the above-described lengths is approximately 2:1. Therefore, the both ends parts (two opposite end parts) in the conveyance direction of each of the pressure chambers 26 (approximately ¼ of the length in the conveyance direction of each of the pressure chambers 26) do not overlap, in the stacking direction, with the projecting portions 245 of the intermediate common electrode 241. Further, the length in the conveyance direction of the wide-width portion 142 of each of the individual electrodes 141 is greater than the length in the conveyance direction of one of the pressure chambers 26.

<Lower Common Electrode 341>

Figure 8:
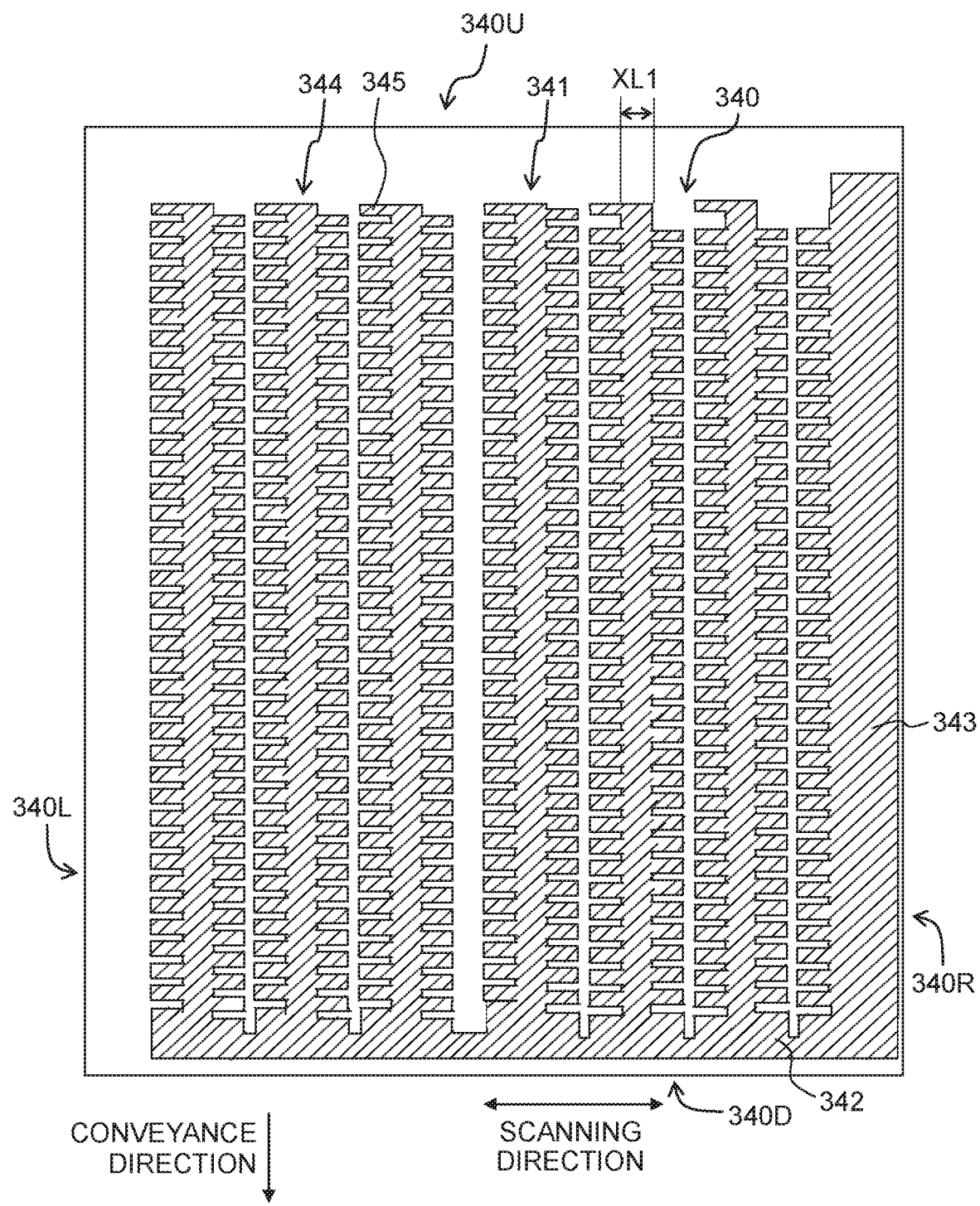
FIG. 8 is a top view of a lower piezoelectric layer 340 according to the embodiment.

As depicted in FIG. 8, the lower common electrode 341 is formed on the upper surface of the lower piezoelectric layer 340. As depicted in FIG. 8, the lower common electrode 341 has an extending portion 342 extending in the scanning direction (the left/right direction) to cover the end portion 340D in the conveyance direction of the lower piezoelectric layer 340, an extending portion 343 extending in the conveyance direction to cover the end portion 340R in the scanning direction of the lower piezoelectric layer 340, six extending portions 344 extending in the conveyance direction from the extending portion 342 toward the end portion 340U in the conveyance direction of the lower piezoelectric layer 340, and a plurality of projecting portions 345 projecting from each of the extending portions 344 toward the two opposite sides (both sides) in the scanning direction. Further, the plurality of projecting portions 345 also project from the extending portion 343 toward the end portion 340L in the scanning direction of the lower piezoelectric layer 340. Note that the extending portion 342 is arranged at a position at which the extending portion 342 does not overlap, in the stacking direction, with the pressure chambers 26 and the individual electrodes 141. Further, the extending portion 342 arranged at the position as described above also does not overlap, in the stacking direction, with the intermediate common electrode 241.

Each of the six extending portions 344 extends in the conveyance direction between the wide-width portions 142 of the individual electrodes 141, forming two individual electrode rows 150 which are adjacent in the scanning direction, such that each of the extending portions 344 does not overlap, in the stacking direction, with the wide-width portions 142 of the individual electrodes 141 forming the two adjacent individual electrode rows 150. In FIG. 8, among the six extending portions 344, the first extending portion 344 from the left extends in the conveyance direction to pass through between, in the scanning direction, the wide-width portions 142 forming the first and second individual electrode rows 150 from the left. The second extending portion 344 from the left extends in the conveyance direction to pass through between, in the scanning direction, the wide-width portions 142 forming the third and fourth individual electrode rows 150 from the left. The third extending portion 344 from the left extends in the conveyance direction to pass through between, in the scanning direction, the wide-width portions 142 forming the fifth and sixth individual electrode rows 150 from the left. The fourth extending portion 344 from the left extends in the conveyance direction to pass through between, in the scanning direction, the dummy electrodes 171 forming the dummy electrode row 170 and the wide-width portions 142 forming the seventh individual electrode row 150 from the left. The fifth extending portion 344 from the left extends in the conveyance direction to pass through, in the scanning direction, between the wide-width portions 142 forming the eighth and ninth individual electrode rows 150 from the left. The sixth extending portion 344 from the left extends in the conveyance direction to pass through between, in the scanning direction, the wide-width portions 142 forming the tenth and eleventh individual electrode rows 150 from the left.

The fourth extending portion 344 from the left is positioned at the boundary between the pressure chamber rows 25 for the color inks and the pressure chamber rows 25 for the black ink. The six extending portions 344 have a same width. With respect to the five remaining extending portions 344 which are different from the fourth extending portions 344 from the left, the individual electrodes 141 forming the two adjacent individual electrode rows 150 which interpose each of the five remaining extending portion 344 in the scanning direction are arranged such that the narrow-width portions 143 belonging to the two individual electrode rows 150 face one another in the scanning direction (see FIG. 5). That is, with respect to the five remaining extending portions 344 which are different from the fourth extending portion 344 from the left, the interval or spacing distance in the scanning direction of the wide-width portions 142 of the individual electrodes 141, forming the two adjacent individual electrode rows 150 interposing each of the five remaining extending portion 344 in the scanning direction, is XL1. The interval or spacing distance in the scanning direction between the dummy electrodes 171 forming the dummy electrode row 170 and the wide-width portions 142 of the individual electrodes 141, forming the seventh individual electrode row 150 from the left, which interpose the fourth extending portion 344 from the left therebetween in the scanning direction, is also XL1. In accordance with this, the width of the six extending portions 344 in the scanning direction is also made to be XL1.

Figure 9B:
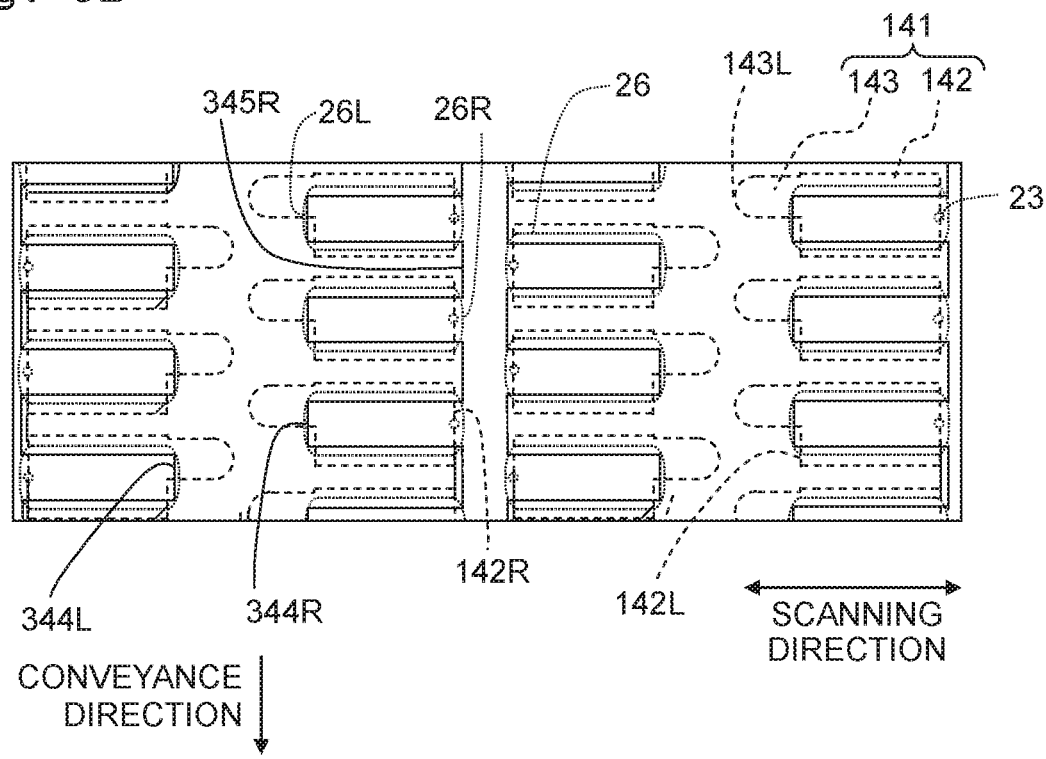
FIG. 9B is a schematic view depicting the overlap of the upper piezoelectric layer 140 and the lower piezoelectric layer 340 according to the embodiment.

Next, referring to FIG. 9B, an explanation will be made about a positional relationship among the pressure chambers 26, the individual electrodes 141, and the lower common electrode 341. In FIG. 9B, although the four individual electrode rows arranged side by side in the scanning direction are depicted, the explanation regarding FIG. 9B will be made about the positional relationship while considering, as an example, the individual electrodes 141 included in the second individual electrode row from the left, and the pressure chambers 26 and lower common electrode 341 overlapping therewith in the stacking direction. In order that the figure is easily viewed, the lower common electrode 341 formed in the lower piezoelectric layer 340 are depicted with solid lines, whereas the pressure chambers 26, the individual electrodes 141, etc., are depicted with dotted lines.

The length in the scanning direction of the projecting portions 345 of the lower common electrode 341 is substantially same as the length in the scanning direction of the wide-width portions 142 of the individual electrodes 141.

The end portion 26L of each of the pressure chambers 26 is positioned, in the scanning direction, between an end portion 344L and an end portion 344R of one of the extending portions 344. The end portion 26R of each of the pressure chambers 26 is arranged at a substantially same position in the scanning direction as the end portion 345R of one of the projection portions 345 of the lower common electrode 341. The end portion 344R of each of the extending portions 344 is positioned, in the scanning direction, between the end portion 26L of one of the pressure chambers 26 and the end portion 142L of the wide-width portion 142 of one of the individual electrodes 141.

Further, as described above, the end portion 142L of each of the wide-width portions 142 is arranged at a substantially same position in the scanning direction as the end portion 245L in the scanning direction of one of the projecting portions 245 of the intermediate common electrode 241 (see FIG. 9A). Therefore, it is appreciated that each of the projecting portions 245 of the intermediate common electrode 241 does not overlap, in the stacking direction, with one of the extending portions 344 of the lower common electrode 341. Further, the end portion 244L of each of the extending portions 244 of the intermediate common electrode 241 is arranged at a substantially same position in the scanning direction as one of the nozzles 23 (see FIG. 9A). Therefore, it is appreciated that each of the projecting portions 345 of the lower common electrode 341 overlaps, in the scanning direction, with one of the extending portions 244 of the intermediate common electrode 241.

The central position, in the conveyance direction, of each of the projecting portions 345 of the lower common electrode 341 is substantially aligned (coincident) with the central position in the interval (spacing distance) between two pressure chambers 26 which are included in the plurality of pressure chambers 26 and which are adjacent in the conveyance direction. The interval between the two adjacent pressure chambers 26 in the conveyance direction is shorter than the length in the conveyance direction of each of the projecting portions 345 of the lower common electrode 341. Therefore, the both end portions in the conveyance direction of each of the pressure chambers 26 overlap, in the stacking direction, with the projecting portions 345 of the lower common electrode 341. Note that the length in the conveyance direction of overlapping portions or parts in the stacking direction between each of the pressure chambers 26 and the projecting portions 345 of the lower common electrode 341 is shorter than ¼ the length in the conveyance direction of each of the pressure chambers 26. As described above, at the both end portions in the conveyance direction of the pressure chambers 26, a portion which is about ¼ the length in the conveyance direction of each of the pressure chambers 26 does not overlap, in the stacking direction, with one of the projecting portions 245 of the intermediate common electrode 241. Therefore, the projecting portions 345 of the lower common electrode 341 do not overlap, in the stacking direction, with the projecting portions 245 of the intermediate common electrode 241.

Note that as described above, the central position, in the conveyance direction, of each of the pressure chambers 26 is substantially coincident with the central position in the conveyance direction of the wide-width portions 142 of one of the individual electrodes 141; and the length in the conveyance direction of the wide-width portion 142 of each of the individual electrodes 141 is greater than the length in the conveyance direction of one of the pressure chambers 26. Therefore, the both end portions in the conveyance direction of each of the wide-width portions 142 overlap, in the stacking direction, with the projecting portions 345 of the lower common electrode 341. The length in the conveyance direction of the overlapped portions or parts in the stacking direction between each of the wide-width portions 142 and the projecting portions 345 of the lower common electrode 341 is greater than length in the conveyance direction of the overlapped portions or parts in the stacking direction between each of the pressure chambers 26 and the projecting portions 345 of the lower common electrode 341.

<Trace Member 50>

Figure 10:
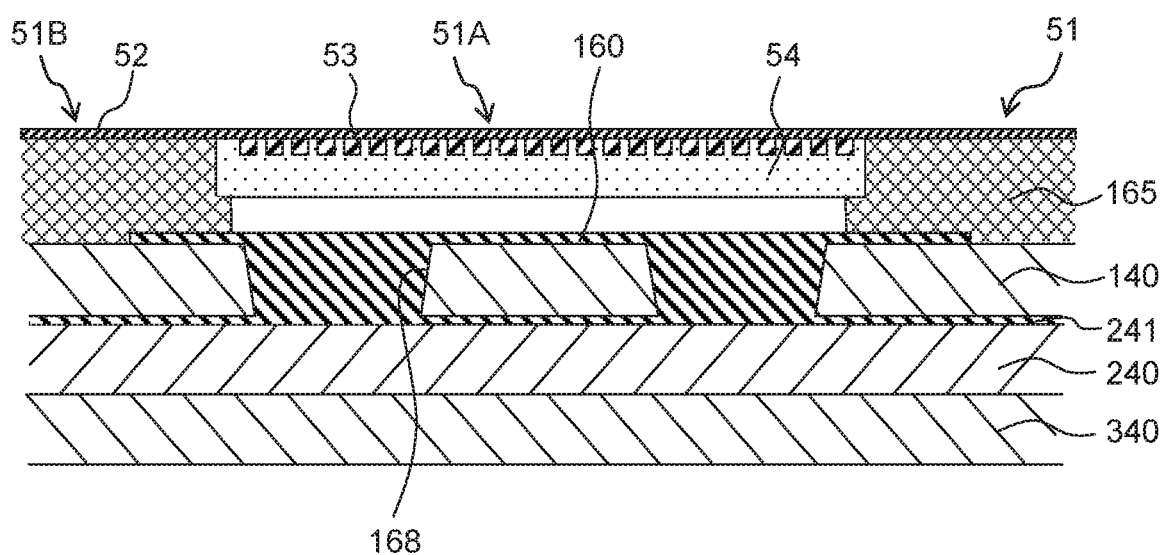
FIG. 10 is a schematic view explaining the connection between a piezoelectric body 40 and a COF 51 according to the present embodiment.

As depicted in FIG. 2, the trace member 50 includes a COF (Chip On Film) 51, and the driver IC 58 arranged on the COF 51. The COF 51 is formed with non-illustrated contact points electrically connected, respectively, to bumps 191 (see FIG. 6) provided on the narrow-width portions 143 of the respective individual electrodes 141, thereby making it possible to set the potential individually for the respective individual electrodes 141. Further, as described above, the driver IC 58 is capable of setting a predetermined constant potential for the intermediate common electrode 241 and the lower common electrode 341. Note that as depicted in FIG. 10, the thickness of the COF 51 is not uniform. The COF 51 has a substrate 52, a plurality of traces 53 arranged on the substrate 52, and a solder resist layer 54 configured to protect the plurality of traces 53. The plurality of traces 53 are not aligned uniformly on the substrate 52; in the substrate, there is a certain portion at which the traces 53 are arranged in a dense manner and another portion at which the writings 53 are not arranged. In the certain portion, of the COF 51, at which the traces 53 are arranged in the dense manner has a thickness greater than the another portion, of the COF 51, at which the traces 53 are not arranged, to the extent by which the certain portion with the traces 53 arranged therein densely is covered by the solder resist layer 54. In the following explanation, a portion, of the COF 51, having a greater thickness due to the traces 53 covered with the solder resist layer 54 is referred to as a thickened portion 51A, and another portion, of the COF 51, at which the traces 53 are absent (are not arranged) is referred to as a thin portion 51B. The COF 51 is arranged such that the thickened portion 51A and the conductive layer 160 overlap with each other in the stacking direction, and that the thinned portion 53B and the conductive layer 165 overlap with each other in the stacking direction.

<Driving of Piezoelectric Elements 401>

As described earlier on, the piezoelectric body 40 is a plate-like member which has an approximately rectangular shape in a plane view, and which is arranged on the vibration plate 30 so as to cover the plurality of pressure chambers 26 (see FIG. 2, for example). The piezoelectric body 40 is formed with a plurality of piezoelectric elements 401 provided to correspond respectively to the plurality of pressure chambers 26. In the following, driving of the piezoelectric elements 401 will be explained. Portions or parts (hereinafter referred to as "first active portions 41"; see FIGS. 4A, 4B)), of the upper piezoelectric layer 140, each of which is interposed in the stacking direction between one of the individual electrodes 141 and the intermediate common electrode 241 are polarized in the stacking direction. Further, portions or parts (hereinafter referred to as "second active portions 42"; see FIGS. 4A, 4B)), of the upper piezoelectric layer 140 and the intermediate piezoelectric layer 240, each of which is interposed in the stacking direction between one of the individual electrodes 141 and the lower common electrode 341 are also polarized in the stacking direction. Here, in a state that the driver IC 58 is powered, a predetermined first potential (24V, for example) is applied constantly to the intermediate common electrode 241, whereas a predetermined second potential (0V, for example) is applied constantly to the lower common electrode 341. Further, the first potential and the second potential are selectively applied to the respective individual electrodes 141. Specifically, in a case that the ink is not to be jetted from a certain pressure chamber 26, among the plurality of pressure chambers 26, corresponding to a certain individual electrode 141, the second potential is applied to the certain individual electrode 141. On this occasion, since there is no potential difference between the certain individual electrode 141 and the lower common electrode 341, the second active portion 42 corresponding to the certain individual electrode 141 does not deform. However, between the individual electrode 141 and the intermediate common electrode 241, there is a potential difference (24V in this case). By virtue of this, the first active portion 41 corresponding to the certain individual electrode 141 deforms to project downward (toward pressure chamber 26).

In a case that the ink is to be jetted from a certain pressure chamber 26 corresponding to the certain individual electrode 141, the first potential is first applied to the certain individual electrode 141, and the potential applied to the certain individual electrode 141 is then returned to the second potential. Namely, such a pulse voltage signal is applied to the certain individual electrode 141 that allows the potential applied to the certain individual electrode 141 to be increased from the second potential (0V) up to the first potential (24V) and then to be returned to the second potential (0V) after elapse of a predetermined time. When the first potential is applied to the certain individual electrode 141, since the potential difference no longer exists between the certain individual electrode 141 and the intermediate common electrode 241, the first active portion 41, which has been deformed to project downward (toward the pressure chamber 26), starts recovering to the state of no-deformation. In this situation, since the first active portion 41 displaces upward, the volume of the pressure chamber 26 is thereby increased. At this time, there is generated a potential difference (24V in this case) between the certain individual electrode 141 and the lower common electrode 341, which in turn causes the second active portion 42 to be deformed such that a central portion of the pressure chamber 26 is raised upward, thereby enabling the further increase in the volume of the pressure chamber 26. Next, when the potential of the certain individual electrode 141 returns from the first potential to the second potential as described above, the potential difference no longer exists between the certain individual electrode 141 and the lower common electrode 341, as described above. Accordingly, although the second active portion 42 recovers or returns to the original state thereof, the potential difference (24V in this case) from the first potential to the second potential is again generated between the certain individual electrode 141 and the intermediate common electrode 241, which in turn causes the first active portion 41 to deform so as to project downward (toward the pressure chamber 26). In this situation, due to the pressure applied on the pressure chamber 26, the ink inside the pressure chamber 26 is jetted from the nozzle 23 corresponding thereto.

<Regarding Warping Deformation of Piezoelectric Material Layer>

Figure 11A:
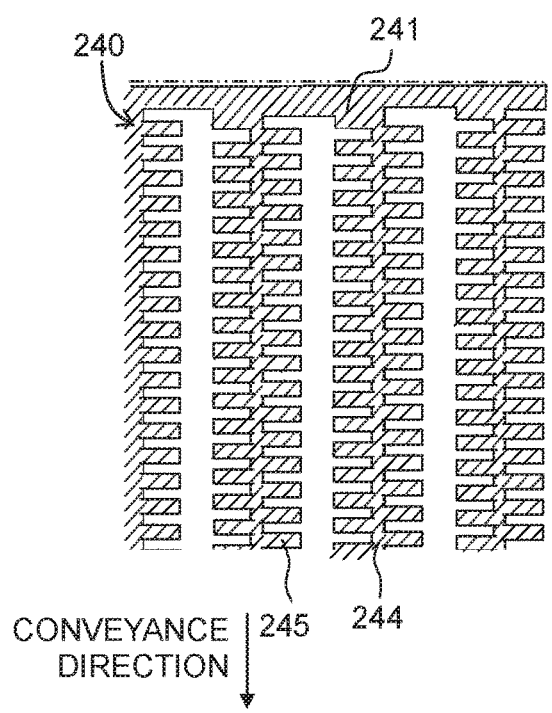
FIGS. 11A to 11C are schematic views explaining a deformation (warpage) occurring in a piezoelectric body.
Figure 11B:
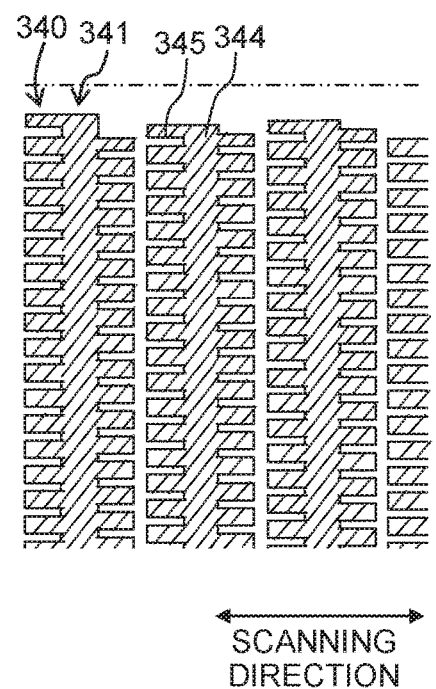
Figure 11C:
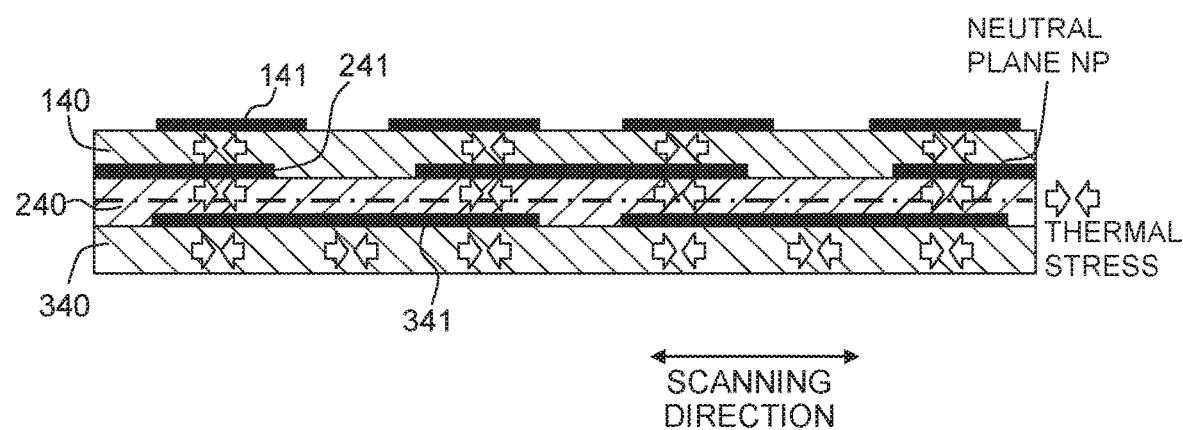

Generally, in a case of forming a thin metallic layer such as the individual electrodes, the intermediate common electrode and the lower common electrode layer on a surface of the piezoelectric material layer, the thin metallic layer is formed on a piezoelectric material sheet by performing printing, etc., and then calcination therefor. As depicted in FIG. 11C, there is a residual thermal stress in the contraction direction in a calcined piezoelectric layer. In the following explanation, the residual thermal stress in the calcined piezoelectric layer will be simply referred to as the "residual stress". The strength of the residual stress becomes greater as the area of the thin metallic layer is greater. In a case that there is any difference in the magnitude between an upper residual stress remaining on the upper side and a lower residual stress remaining on the lower side with a neutral plane NP being sandwiched therebetween in the stacking direction, then the piezoelectric body 40 deforms to warp in the stacking direction, depending on the above-described difference in the magnitude between the upper and lower residual stresses.

A distance in the stacking direction from the neutral plane NP to the upper surface of the upper piezoelectric layer 140 on which the individual electrodes 141 are formed is greater than a distance in the stacking direction from the neutral plane NP to the upper surface of the intermediate piezoelectric layer 240 and a distance in the stacking direction between the neutral plane NP and the upper surface of the lower piezoelectric layer 340. Accordingly, in such a case that any thin metallic film layer is excessively formed on the surface of the upper piezoelectric layer 140 and the calcination is performed therefor, the warpage deformation of the piezoelectric body 140 is made great, as a result.

In the above-described embodiment, the conductive layer 165 formed on the upper surface of the upper piezoelectric layer 140 is constructed (formed) of the bumps configured to be joined to the COF 51 by the DC joining. Therefore, the conductive layer 165 do not contribute to the warping deformation of the piezoelectric body 40. The reason therefor will be explained as follows.

Generally, as a method for joining the COF with a metallic thin film layer such as an electrode, etc., formed on a surface of a piezoelectric material layer, there is known the CC joining (Cover Coat joining), DC joining (Direct Connection joining), etc. In the CC joining, firstly, bumps are formed on the metallic thin film layer such as electrodes, etc., by a method such as printing (screen printing), and then the formed bumps are hardened (cured). Next, a thermo-curable adhesive is printed on a surface of the COF at a location facing the bumps. Further, the bumps formed on the metallic thin film layer and the thermo-curable adhesive arranged on the surface of the COF are positioned with respect to the each other, and then are heated and pressurized, thereby adhering (joining) the bumps and the thermo-curable adhesive. In such a manner, in the CC joining, the bumps and the COF are joined with the thermo-curable adhesive. In contrast, in the DC joining adopted in the present embodiment, the bumps formed on the metallic thin film layer and the COF are joined directly to each other, without using any thermo-curable adhesive.

Figure 12A:
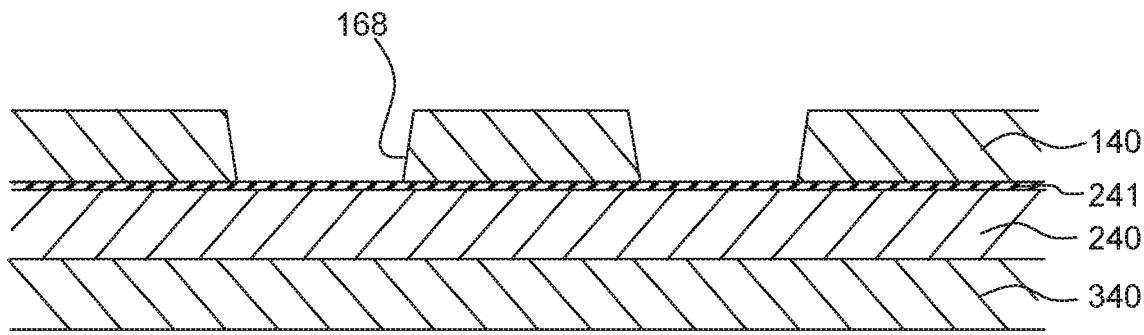
FIGS. 12A to 12C are schematic views explaining a DC joining (connection).
Figure 12B:
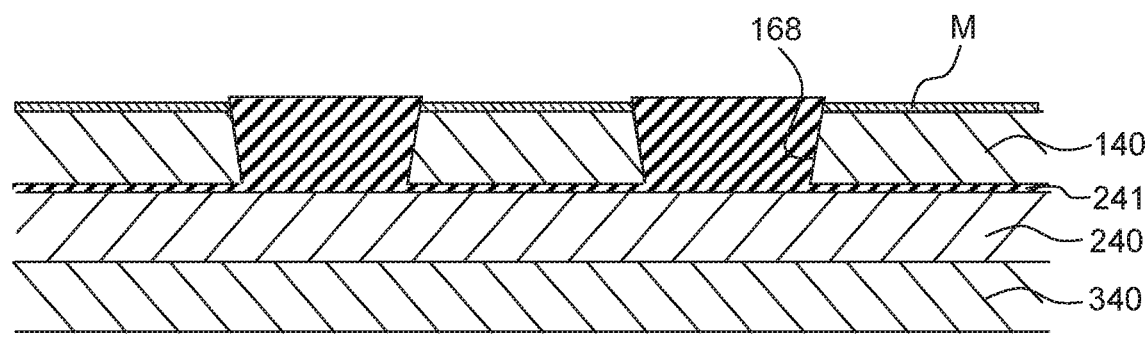
Figure 12C:
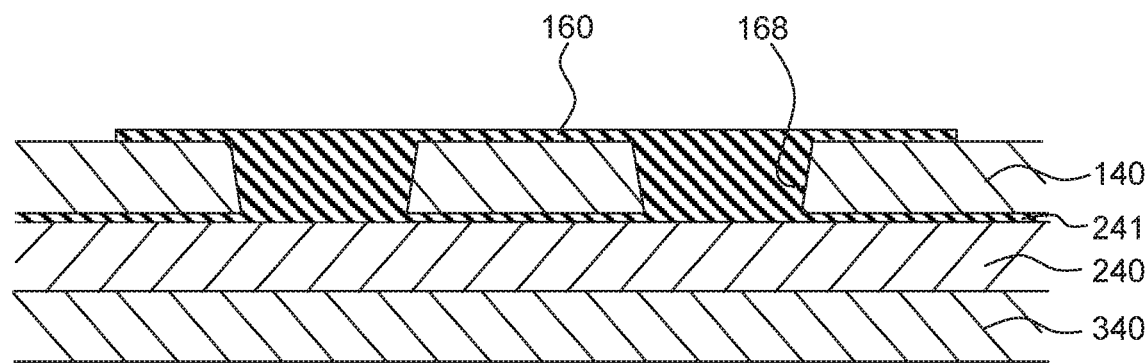
Figure 13A:
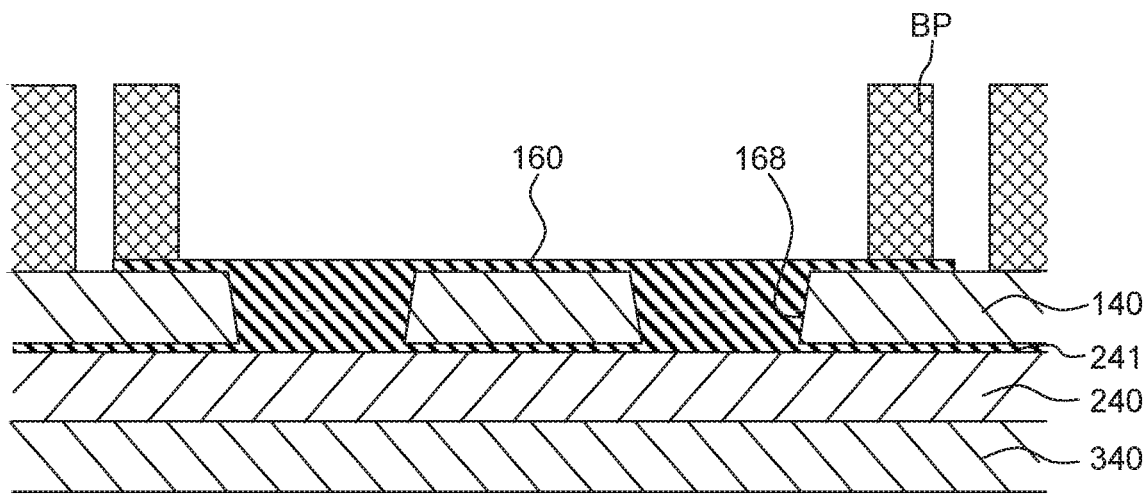
FIGS. 13A and 13B are schematic views explaining the DC joining.
Figure 13B:
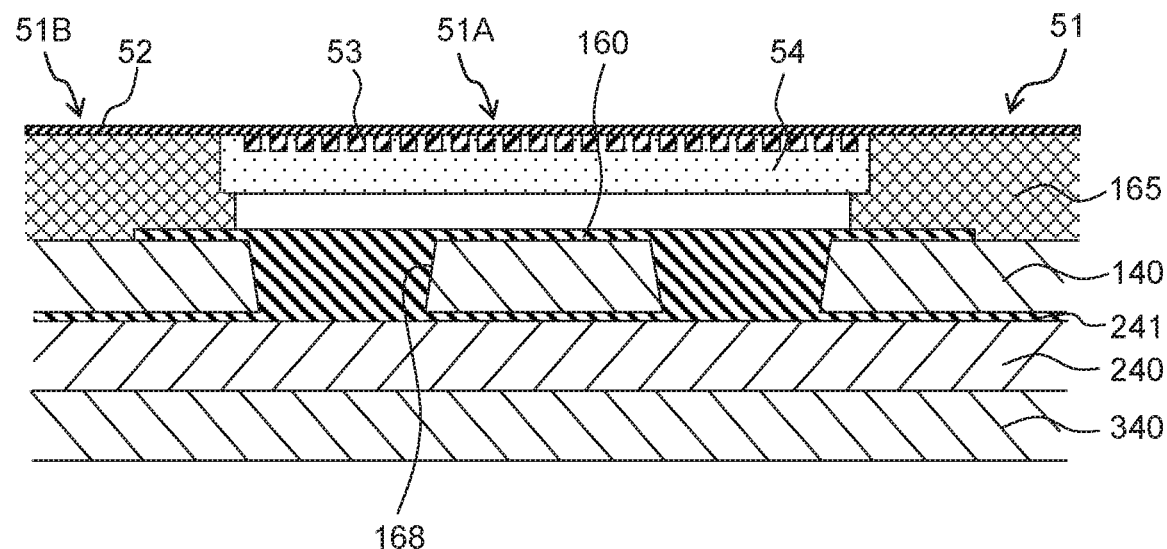

The DC joining will be explained, while referring to FIGS. 12A to 12C, 13A and 13B. At first, as depicted in FIG. 12A, a piezoelectric body 40 formed by stacking a lower piezoelectric layer 340, an intermediate piezoelectric layer 240 formed with the intermediate common electrode 241, and an upper piezoelectric layer 140 formed with the through holes 168. Note that although not depicted in FIG. 12A, the lower common electrode 341 is formed in the lower piezoelectric layer 340, and the terminals 280R and the through holes 281 are formed in the intermediate piezoelectric layer 240. Further, the through holes 181L, 181R are also formed in the upper piezoelectric layer 140. Next, as depicted in FIG. 12B, a mask M having openings of which diameter is substantially same as that of the through holes 168 is overlaid on the upper piezoelectric layer 140, and a conductive material (silver palladium (AgPd)) is coated on the upper piezoelectric layer 140. Although not depicted in FIG. 12B, the mask M also has openings of which diameter is substantially same as that of the through holes 181L and 181R, and when the mask M is positioned above and then arranged on the upper piezoelectric layer 140, the through holes 168, 181L and 181R are exposed from the mask M. In this state, the conductive material (silver palladium (AgPd)) is coated on the upper piezoelectric layer 140, thereby filling the conductive material in the inside of each of the through holes 168, 181L and 181R. Next, as depicted in FIG. 12C, in a state that the mask M is removed, the conductive layers 160 are formed on the upper surface of the upper piezoelectric layer 140 by a method such as the screen printing, etc., with the silver palladium (AgPd). In this procedure, the individual electrodes 141, the terminals 180L, 180R, and the dummy electrodes 198, 199 are also concurrently formed of the same conductive material (silver palladium (AgPd)). Next, after calcinating the stacked body 40, bumps BP are formed on each of the conductive layers 160 as depicted in FIG. 13A, by a method such as the screen printing, etc. As described above, the bumps BP are formed of a conductive adhesive such as silver paste, etc. Next, in a state that the bumps BP are not cured yet, the bumps BP formed on each of the conductive layers 160 and the COF 51 are positioned relative to each other, then heating is performed while pressing the COF 51 against the bumps BP, as depicted in FIG. 13B, thereby curing the bumps BP. With this, the joining (connection) of the bumps BP and the COF 51 is performed. In a process of pressing the COF 51 against the bumps BP, the bumps BP are crushed. As described above, in the present embodiment, the bumps BP deformed by being pressed and crushed by the COF 51 are cured, thereby forming a conductive layer 165 in which the deformed bumps BP are connected (linked) to one another in a row. As described above, since the DC joining is performed in a state that the conductive layers 160 are formed, the conductive layer 165 is arranged such that a part or portion of the conductive layer 165 is overlapped with each of the conductive layers 160, as depicted in FIG. 13B.

Also in the DC joining as described above, the heating is performed while curing the bumps. However, the heating is performed at a temperature which is lower than the temperature for calcinating the individual electrodes 141 and the conductive layer 165. Accordingly, the residual thermal stress in the conductive layers 165 is small to such an extent that the residual thermal stress can be ignored, as compared with the residual thermal stress remaining in the individual electrodes 141 and the conductive layers 160 in the calcination of the individual electrodes 141 and the conductive layers 160.

In the above-described embodiment, the intermediate common electrode 241 and the terminals 180L are conducted to one another via the conductive layers 160 and 165 and the conductive body in the inside of the through holes 168. The plurality of conductive layers 160 formed with the through holes 168 are arranged such that the conductive layers 160 are dispersed in a plurality of locations which are apart from one another in the scanning direction. With this, there is provided a plurality of electrical routes (bypass traces) from the terminals 180L and reaching up to the intermediate common electrode 241. Accordingly, even in such a case that a sufficient amount of the conductive material is not charged in a certain through hole 168 among the plurality of through holes 168, which in turn causes any electric disconnection at a certain electrical route (corresponding to the certain through hole 168), it is possible to supply the electric charge, via the bypass trace, to the intermediate common electrode 241, thereby making it possible to improve the reliability in the electrical connection.

In the present embodiment, the plurality of conductive layers 165 are formed in the vicinity of the end portion 140U of the upper piezoelectric layer 140, and are connected to the COF 51 by means of the DC joining. The vicinity of the end portion 140U of the upper piezoelectric layer 140 is a location or portion at which the COF 51 is particularly easily deformed. Therefore, by providing the conductive layers 165 on this location, it is possible to strengthen the joining (connection) strength between the COF 51 and the piezoelectric body 40.

In the present embodiment, the seven pieces of the conductive layer 160 are arranged side by side in the scanning direction at a spacing distance therebetween, and the conductive layers 165 are formed so as to link (connect) the seven pieces of the conductive layers 160. Since the conductive layers 165 are constructed of the bumps configured to be joined to the COF 51 by the DC joining, the conductive layers 165 do not contribute to the warping deformation of the piezoelectric body 40. Accordingly, as compared with a case in which one conductive layer 160 which is elongated in the scanning direction is provided (see FIG. 14B), it is possible to suppress the residual stress to be small, and thus to make the warping deformation of the piezoelectric body to be small.

In a case that an adhesive is used to join the piezoelectric body 40 to the vibration plate 30, the adhesive swells or protrudes out up to the upper surface of the piezoelectric body 40 (namely, to the upper surface of the upper piezoelectric layer 40), in some cases. In a case that the adhesive flows up to the area at which the individual electrodes 141 are formed, the flowed adhesive might compromise or hinder the function as the piezoelectric elements. In this embodiment, since the conductive layers 160 and 165 are formed between the end portion 141U of the upper piezoelectric layer 140 and the individual electrodes 141, the conductive layers 160 and 165 function as a barrier stopping the adhesive. Since the conductive layers 160 which are adjacent in the scanning direction are arranged such that the narrow-width portions 163 thereof face each other in the scanning direction, the adjacent conductive layers 160 are allowed to function as the barrier. In the present embodiment, the wide-width portions 162 of the conductive layers 160 which are adjacent in the scanning direction are connected (linked) to each other by each of the conductive layers 165. In order to avoid the influence of the adhesive as much as possible, the end portions, of the wide-width portions 162, which are apart and away from the end portions 140U in the conveyance direction are connected to each other by each of the conductive layers 165. This makes it possible to improve the reliability in the electrical connection between the conductive layers 165 and the conductive layers 160.

Further, since the conductive layers 165 are formed to have a height greater than that of the conductive layers 160, the effect as the barrier is high. Note that the position in the scanning direction of the conductive layers 165 are same as those of the narrow-width portions 143 of the individual electrodes 141; the bumps 191 which are (to be) connected to the COF 51 are provided on the narrow-width portions 143, respectively. Due to this configuration, the conductive layers 165 are capable of suppressing such a situation that the adhesive reaches up to the bumps 191, thereby making it possible to improve the reliability in the electrical connection between the COF 51 and the bumps 191. Note that since the bumps 191 are arranged on the narrow-width portions 143, respectively, the diameter of each of the bumps 191 cannot be made greater than the length in the conveyance direction of one of the narrow-width portions 143. However, since there is no such a limitation in the size (dimension) of the bumps provided when forming the conductive layers 165, the diameter of the bumps can be made great than the diameter of the bumps 191, to thereby improve the barrier function of the conductive layers 165. Further, since the cross section of the conductive layers 165 can be made great, the value of resistance can be lowered.

Figure 14A:
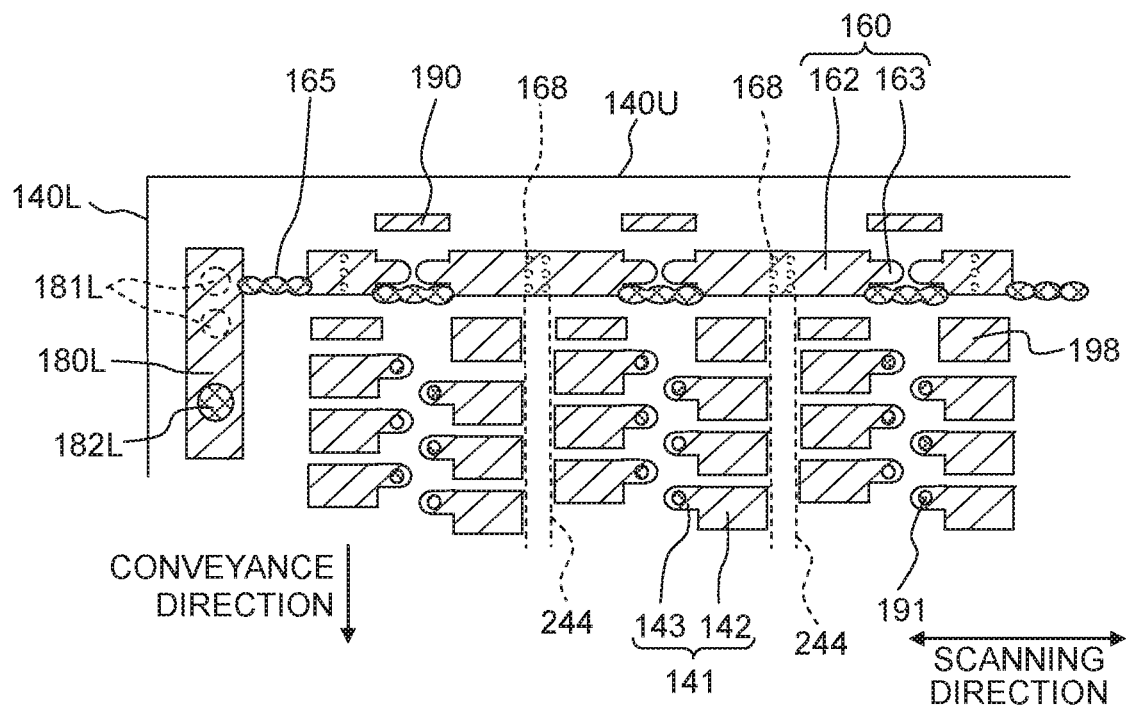
FIG. 14A is a schematic view explaining a conductive layer 190 for barrier (barrier conductive layer 190)
Figure 14B:
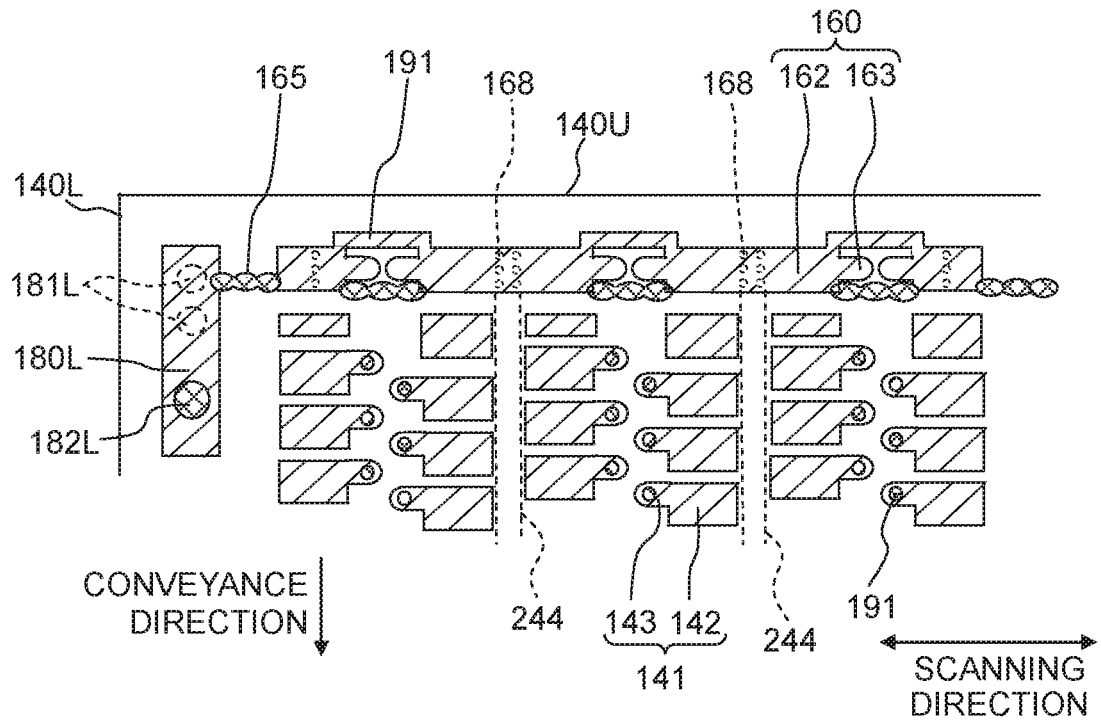
FIG. 14B is a schematic view explaining a conductive layer 191 for barrier (barrier conductive layer 191).

Note that another conductive layer can be provided, as a barrier for stopping the adhesive, between the end portion 140U of the upper piezoelectric layer 140 and the individual electrodes 141. For example, as depicted in FIG. 14A, a conductive layer 190 extending in the scanning direction may be provided between the end portion 141U of the upper piezoelectric layer 140 and the conductive layers 160 and 165. For example, as depicted in FIG. 14B, a conductive layer 191 may be provided so as to connect the wide-width portions 162, of the conductive layers 160, to each other. The conductive layers 190, 191 may be formed of a conductive material such as silver palladium (AgPd), similarly to the conductive layers 160. In such a case, the conductive layers 190, 191 may be formed in the same step for forming the conductive layers 160 and the individual electrodes 141. Alternatively, the conductive layers 190, 191 may be formed of a conductive adhesive such as silver paste, similarly to the conductive layers 165). In such a case, the conductive layers 190, 191 may be formed in the same step for forming the conductive layers 165. Further, by joining the conductive layers 190, 191 to the COF 51 by the DC joining similarly to the conductive layers 165, it is possible to further enhance the connection (joining) strength between the piezoelectric body 40 and the COF 51.

In the above-described embodiment, the intermediate common electrode 241 and the terminals 180L are conducted via the conductive layers 160 and 165 and the conductive material in the inside of the through holes 168. The positions in the scanning direction of the through holes 168 are same as the position in the scanning direction of each of the extending portions 244 of the intermediate common electrode 241. In the above-described embodiment, corresponding to all the extending portions 244, the through holes 168 are formed at positions, respectively, in the scanning direction all of which are same as the positions in the scanning direction of each of the extending portions 244. Accordingly, each of the extending portions 244 can be maintained at the predetermined potential by supplying the charge to each of the extending portions 244 from the COF 51 connected to the terminals 180L, via the conductive layers 160 and 165 and the through holes 168. Further, the respective extending portions 244 are connected to one another via the extending portion 242, as depicted in FIG. 7. Therefore, even in such a case that a sufficient amount of the conductive material is not charged in a certain through hole(s) 168 corresponding to a certain extending portion 244 among the extending portions 244, due to which any electric disconnection is caused in an electrical route reaching up to the certain extending portion 244, it is possible to supply the electric charge to the certain extending portion 244 of the intermediate common electrode 241, via another through hole(s) 168 corresponding to another extending portion(s) 244 which is (are) adjacent in the scanning direction to the certain extending portion 244, thereby making it possible to improve the reliability in the electrical connection.

Since the upper piezoelectric layer 140 is stacked on the extending portions 244 formed on the surface of the intermediate common electrode 240, it is not possible to allow the extending portions 244 to have a great thickness in the stacking direction. In contrast, the conductive layers 160 and 165 formed on the upper surface of the upper piezoelectric layer 140 are allowed to have a greater thickness as compared with that of the extending portions 244. This makes it possible to allow the cross section of the electrical route formed by the conductive layers 160 and 165 to be great, thereby making it possible to lower the value of resistance. This makes it possible, in the present embodiment, to supply the charge to the intermediate common electrode 240 via the electrical route formed of the conductive layers 160 and 165 and having a low electric resistance value, thereby making it possible to increase the reliability in the electrical connection.

In the present embodiment, the plurality of conductive layers 165 are formed in the vicinity of the end portion 140U of the upper piezoelectric layer 140, and are connected to the COF 51 by means of the DC joining. The vicinity of the end portion 140U of the upper piezoelectric layer 140 is a location or portion at which the COF 51 is particularly easily deformed or bent. Therefore, by providing the conductive layers 165 on this location, it is possible to enhance the joining (connection) strength between the COF 51 and the piezoelectric body 40.

<Modifications>

Figure 15:
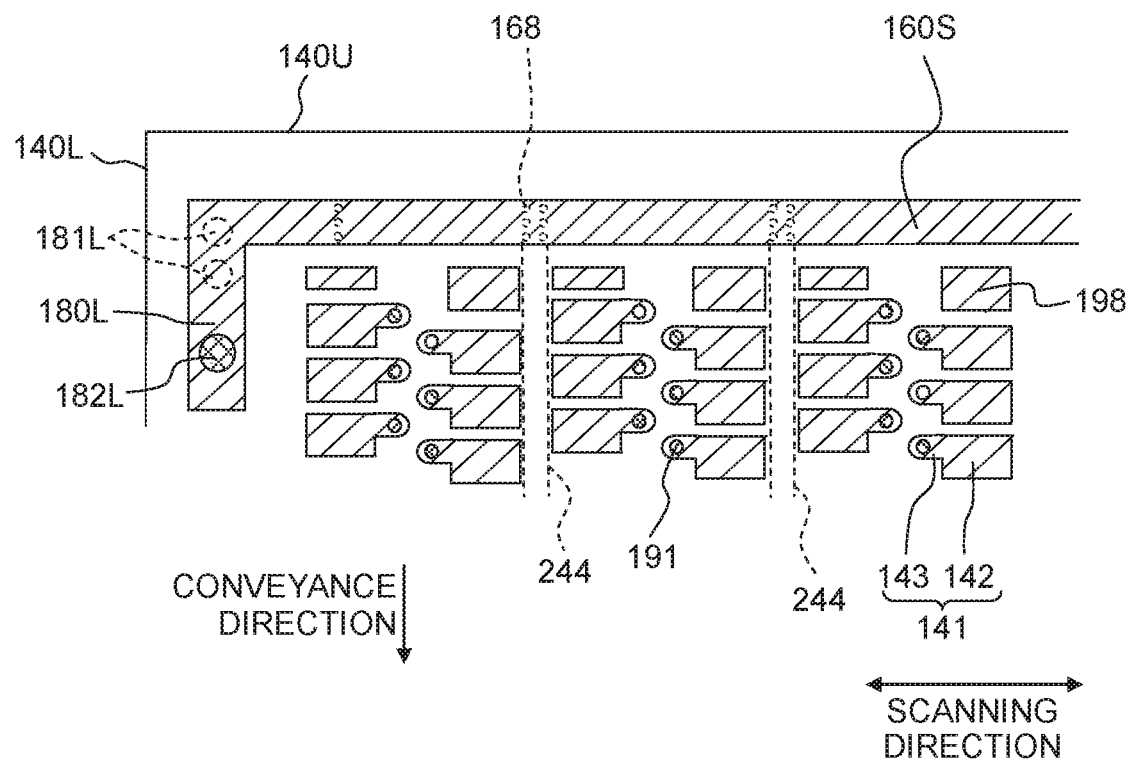
FIG. 15 is a schematic view for explaining a conductive layer 160 according to a modification.

In the above-described embodiment, although the seven pieces of the conductive layer 160 are provided, the number of the conductive layer 160 can be set in an arbitrary manner. Further, the shape of the conductive layer 160 is not limited to or restricted by the example indicated in the present embodiment, and can be set in an arbitrary manner. For example, the conductive layer 160 may be formed to have a shape same as that of the terminal 180L. Alternatively, as depicted in FIG. 15, a single conductive layer 160S extending in the scanning direction can be formed in a location or clearance in the conveyance direction between the end portion 140U of the upper piezoelectric layer 140 and individual electrodes 141 which are included respectively in the individual electrode rows 150 and which are closest (located most closely) to the end portion 140U. Similarly to the above-described embodiment, the conductive layer 160S is formed at a position overlapping, in the stacking direction, with the extending portion 242 of the intermediate common electrode 241. An end portion in the scanning direction of the conductive layer 160S is connected to one of the terminals 180L. The conductive layer 160S can be formed with a conductive material such as silver palladium (AgPd) similarly to the individual electrodes 141 and the terminals 180L. In such a case, the conductive layer 160S may be formed in the same step for forming the individual electrodes 141 and the terminals 180L. A plurality of through holes 168 are formed in the conductive layer 160S; a conductive material is filled in each of the through holes 168. Similarly to the above-described embodiment, the conductive material filled in each of the through holes 168 is conducted with the extending portion 242 of the intermediate common electrode 241.

Figure 16A:
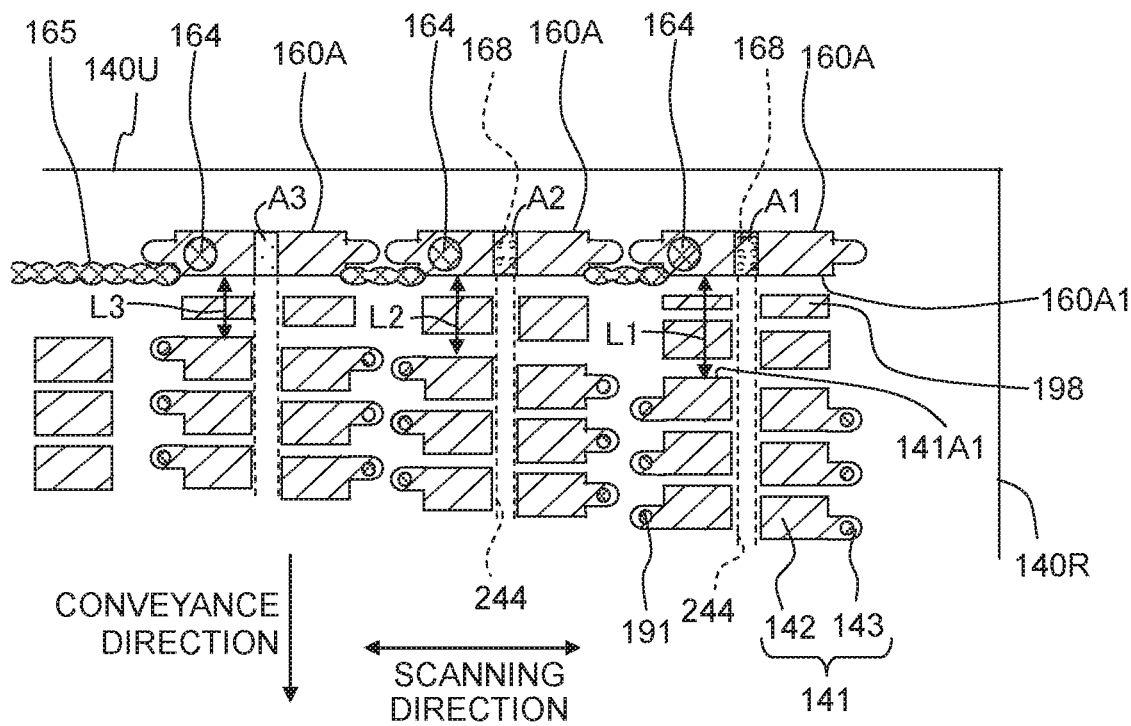
FIG. 16A is a schematic view for explaining a conductive layer 160A according to a modification.

In the embodiment, the conductive layers 160 are connected to the terminals 180L via the conductive layers 165. The bumps 182L which are connected to the COF 51 are provided respectively on the terminals 180L. With this, the charge is supplied from the driver IC 58 of the COF 51 to the intermediate common electrode 241 via the bumps 182L, the terminals 180L, the conductive layers 165 and 160, and the conductive material charged into the through holes 168, thereby making it possible to maintain the intermediate common electrode 241 at the predetermined potential. The present disclosure, however, is not limited to or restricted by the above-described aspect. For example, as depicted in FIG. 16A, it is allowable to form bumps 164 which are to be connected to the COF 51 respectively on a plurality of conductive layers 160A each having through holes 168 formed therein. As depicted in FIG. 16A, the plurality of conductive layers 160A have a planar shape similarly to that of the conductive layers 160 of the above-described embodiment, and are arranged at same positions as those of the conductive layers 160. Note that as depicted in FIG. 16A, the terminals 180R and any conductive layer connecting the conductive layers 160A and the terminals 180R are not provided on the upper surface of the upper piezoelectric layer 140. Further, although not depicted in FIG. 16A, the terminals 180L and the terminals 280R are also not provided in the present modification.

Figure 16B:
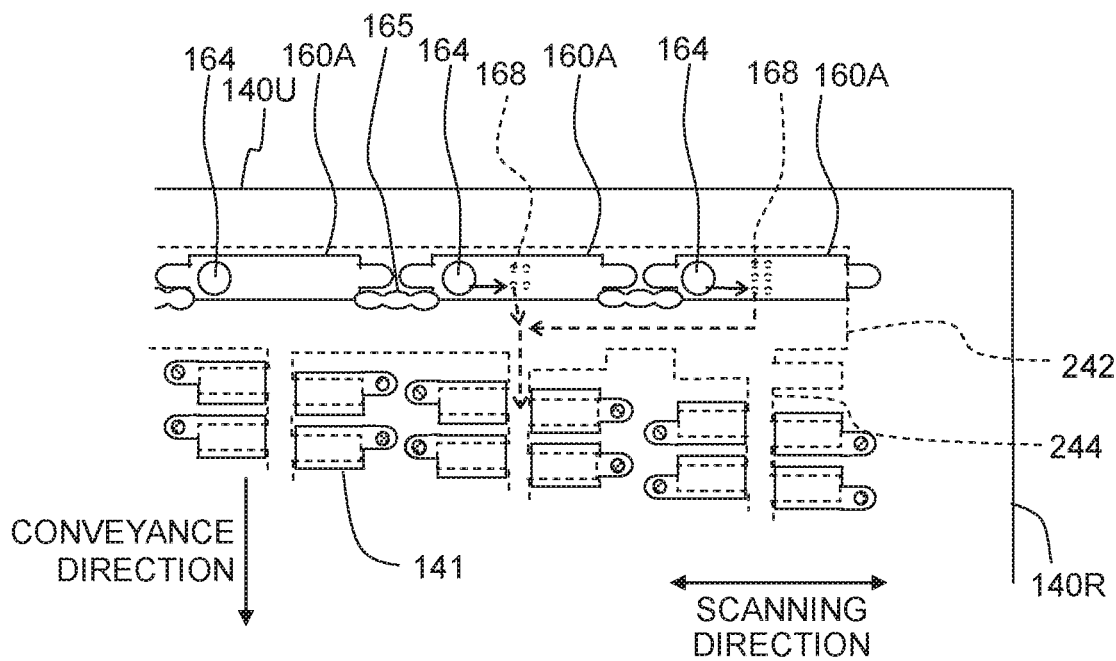
FIG. 16B is a schematic view for explaining the electrical route in the modification.

Although it is allowable that the number of the through hole 168 provided on each of the conductive layers 160A is same among the conductive layers 160A, it is allowable to change the number of the through hole 168, as depicted in FIG. 16A, depending on the distance in the conveyance direction between each of the conductive layers 160A and an individual electrode 141 which is included in the individual electrodes 141 in one of the individual electrode rows 150 and which is located closest (most closely) to the end portion 140U. In FIG. 16A, the number of the through hole 168 provided on a first conductive layer 160A from the right is 6 (six); the number of the through hole 168 provided on a second conductive layer 160A from the right is 4 (four); and the number of the through hole 168 provided on a third conductive layer 160A from the right is 0 (zero). Here, in a case that the first extending portion 244 from the right is extended in the conveyance direction, an area overlapping in the stacking direction with the first conductive layer 160A from the right, as depicted in FIG. 16A, is referred to as a first area A1. Similarly, as depicted in FIG. 16A, in a case that the second extending portion 244 from the right is extended in the conveyance direction, an area overlapping in the stacking direction with the second conductive layer 160A from the right is referred to as a second area A2; and in a case that the third extending portion 244 from the right is extended in the conveyance direction, an area overlapping in the stacking direction with the third conductive layer 160A from the right is referred to as a third area A3. In a case that the first area A1, second area A2 and third area A3 are defined in such a manner, a number N1 of the through hole 168 provided on the first area A1 is 6 (six), a number N2 of the through hole 168 provided on the second area A2 is 4 (four) and a number N3 of the through hole 168 provided on the third area A3 is 0 (zero). As depicted in FIGS. 16A and 16B, as the distance in the conveyance direction between each of the conductive layers 160A and the individual electrode 141 closest to the end portion 140U becomes shorter, the number of the through hole 168 formed in each of the conductive layers 160A is made to be smaller. The reason for this is as follows: in a case that the conductive layers 160A are calcinated, shrinkage occurs in the conductive layers 160A. In this situation, if the plurality of through holes 168 are densely formed in the conductive layers 160A, any local deformation easily occurs in a portion or part, of the conductive layer 160A, in which the plurality of through holes 168 are formed. In a case that such a local deformation is great, the ink-jet head 5 becomes consequently to be a defective product. Therefore, it is desired to reduce such a portion in which the local deformation easily occurs to be as small as possible, and to reduce the incident of defective products. Particularly in such a case that the through holes 168 are formed at the location close to the individual electrodes 141, there is such a fear that if the above-described local deformation occurs, the jetting characteristic from a certain nozzle, included in the plurality of nozzles and corresponding to the closest individual electrode 141 might change, as compared with the jetting characteristic of other nozzle(s) which is different from the certain nozzles.

In the present modification, as depicted in FIGS. 16A and 16B, as the distance in the conveyance direction between each of the conductive layers 160A and the individual electrode 141 closest to the end portion 140U becomes shorter, the number of the through hole 168 formed in each of the conductive layers 160A is made to be smaller. As depicted in FIG. 16A, regarding the both ends in the conveyance direction of each of the conductive layers 160A, an end closer to the individual electrode 141 is referred to as an end 160A1; regarding the both ends in the conveyance direction of each of the individual electrodes 141, an end closer to the conductive layer 160A is referred to as an end 141A1. The first and second individual electrodes 141 from the right are arranged side by side, in the conveyance direction, with respect to the first conductive layer 160A from the right. Similarly, the third and fourth individual electrodes 141 from the right are arranged side by side, in the conveyance direction, with respect to the second conductive layer 160A from the right; the fifth and sixth individual electrodes 141 from the right are arranged side by side, in the conveyance direction, with respect to the third conductive layer 160A from the right. A distance in the conveyance direction between the end 161A1 of the first conductive layer 160A from the right and the end 141A1 of each of individual electrodes 141, which are included in the individual electrodes 141 constructing the first and second individual electrode rows from the right and which are closest to the conductive layer 160A in the conveyance direction, is made to be as a distance L1. A distance in the conveyance direction between the end 161A1 of the second conductive layer 160A from the right and the end 141A1 of each of individual electrodes 141, which are included in the individual electrodes 141 constructing the third and fourth individual electrode rows from the right and which are closest to the conductive layer 160A in the conveyance direction, is made to be as a distance L2. A distance in the conveyance direction between the end 161A1 of the third conductive layer 160A from the right and the end 141A1 of each of individual electrodes 141, which are included in the individual electrodes 141 constructing the fifth and sixth individual electrode rows from the right and which are closest to the conductive layer 160A in the conveyance direction, is made to be as a distance L3. As depicted in FIG. 16A, a relationship of L1>L2>L3 is satisfied. Further, corresponding to the situation that the relationship of L1>L2>L3 is satisfied, the number N1 of the through hole 168 formed in the first conductive layer 160A from the right is 6 (six); the number N2 of the through hole 168 formed in the second conductive layer 160A from the right is 4 (four); and the number N3 of the through hole 168 formed in the third conductive layer 160A from the right is 0 (zero). In this case, since the through hole 168 is not provided on the third conductive layer 160A from the right of which distance in the conveyance direction between the conductive layer 160A and the individual electrode 141 (which is closest to the conductive layer 160A) is the shortest, it is possible to lower any effect to the individual electrode(s) 141 which would be otherwise occurred due to the above-described local deformation caused by the provision of the through holes 168.

Also in the modification, as depicted in FIG. 16B, it is possible to supply the charge to one (each) piece of the extending portions 244 via a plurality of electrical routes. As depicted in FIG. 16B, an electrical route on the upper surface of the upper piezoelectric layer 140 is depicted by arrows of solid lines, and an electrical route on the upper surface of the intermediate piezoelectric layer 240 is depicted by arrows of dotted lines, in a similar manner as in FIG. 6B. Further, in FIG. 16B, the illustration of the dummy electrodes 198 is omitted, and a part or portion of the hutching is omitted, for simplifying the drawing. As depicted in FIG. 16B, a part of the charge supplied from a terminal 164 of the first conductive layer 160A from the right is supplied to the extending portion 242 of the intermediate common electrode 241 via (by passing through) one of the six through holes 168, and is supplied to the first extending portion 244 from the right. A part of the charge supplied to the extending portion 242 of the intermediate common electrode 241 via (by passing through) the six through holes 168 is supplied also to the second extending portion 244 from the right, via (by passing through) the extending portion 242. Further, a part of the charged supplied to a terminal 164 provided on the second conductive layer 160A from the right is supplied to the extending portion 242 of the intermediate common electrode 241 via (by passing through) one of the four through holes 168 provided on the second conductive layer 160A from the right, and is supplied to the second extending portion 244 from the right. As described above, it is possible to supply the charge with respect to one (each) piece of the extending portions 244 via the plurality of electrical routes. Note that the electrical routes depicted in FIG. 16B is a mere example, and there are a plurality of non-illustrate electrical routes. With this, for example in such a case that a large amount of the charge is required for the first extending portion 244 from the right, a part of the charge supplied to another extended portion 244 can be supplied to the first extended portion 244 from the right, via the extended portion 242.

Figure 17:
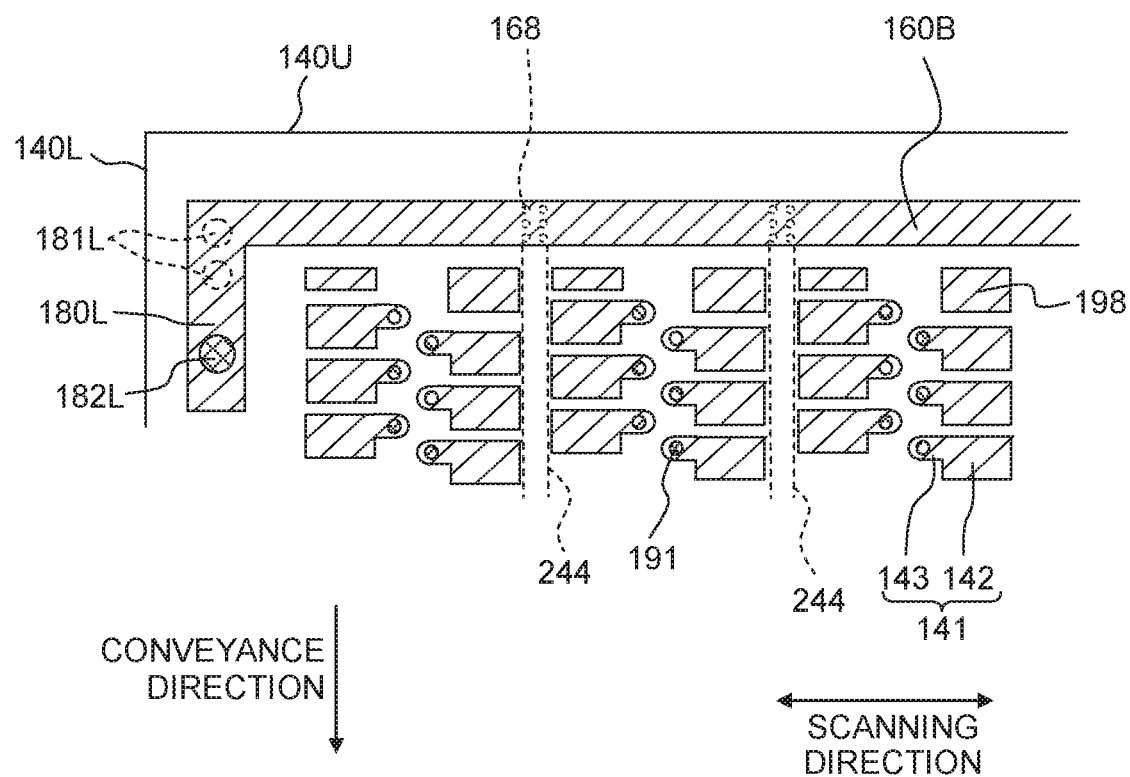
FIG. 17 is a schematic view for explaining a conductive layer 160B according to a modification.

In the above-described embodiment, although the seven pieces of the conductive layer 160, 160A are provided, the number of the conductive layer 160, 160A can be set in an arbitrary manner. Further, the shape of the conductive layer 160, 160A is not limited to or restricted by the examples indicated in the embodiment, and can be set in an arbitrary manner. For example, the conductive layer 160, 160A may be formed to have a rectangular shape same as that of the terminal 180L. Alternatively, as depicted in FIG. 17, a (single) conductive layer 160B extending in the scanning direction can be formed in a location or clearance in the conveyance direction between the end portion 140U of the upper piezoelectric layer 140 and individual electrodes 141 which are included respectively in the individual electrode rows 150 and which are located closest (most closely) to the end portion 140U. Similarly to the above-described embodiment, the conductive layer 160B is formed at a position overlapping, in the stacking direction, with the extending portion 242 of the intermediate common electrode 241. An end portion in the scanning direction of the conductive layer 160B is connected to one of the terminals 180L. The conductive layer 160B can be formed with a conductive material such as silver palladium (AgPd) similarly to the individual electrodes 141 and the terminals 180L. In such a case, the conductive layer 160B may be formed in the same step for forming the individual electrodes 141 and the terminals 180L. Similarly to the above-described embodiment, a plurality of through holes 168 are formed in the conductive layer 160B. Note that similarly to the above-described embodiment, the positions in the scanning direction of the through holes 168 are same as the position in the scanning direction of each of the extending portions 244 of the intermediate common electrode 241. Similarly to the above-described embodiment, the conductive material is filled in each of the through holes 168 and is conducted with each of the extending portions 242 of the intermediate common electrode 241.

Figure 18:
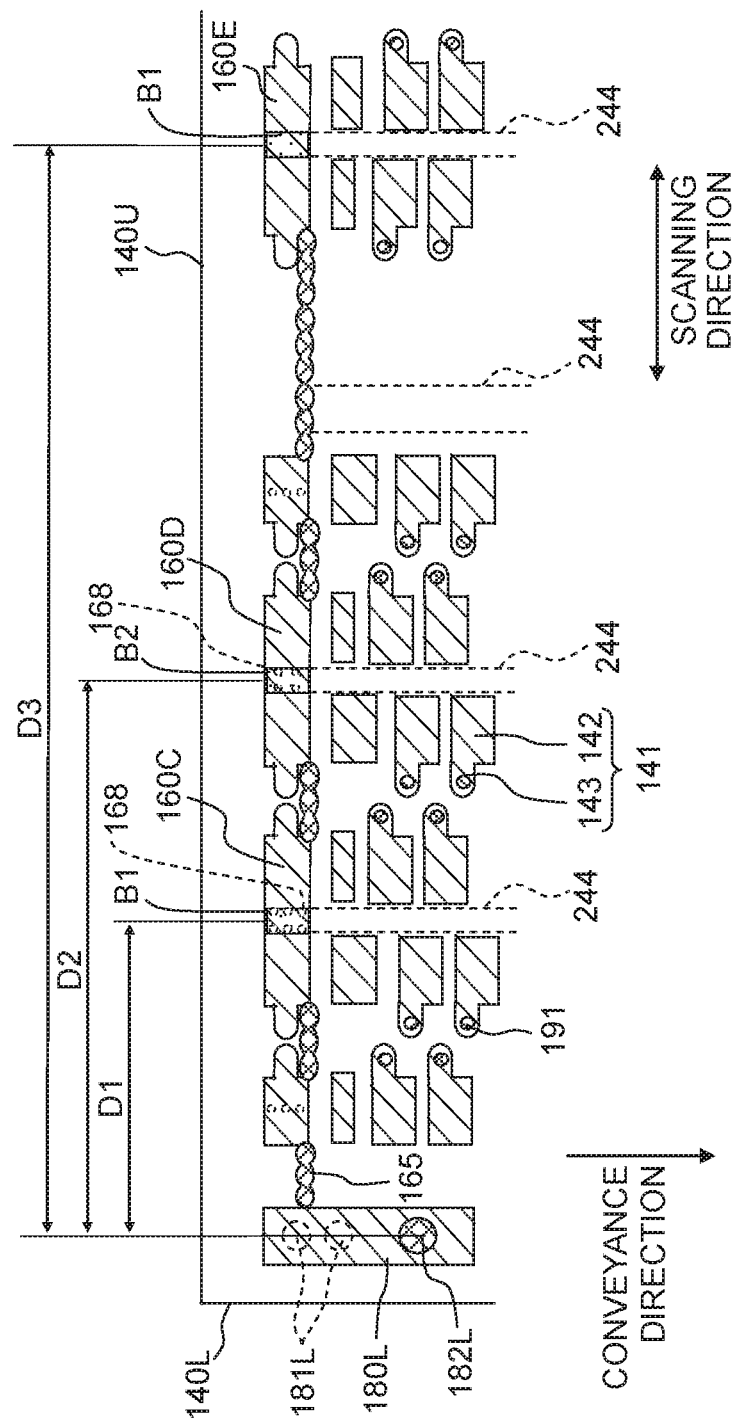
FIG. 18 is a schematic view for explaining conductive layers 160C to 160E according to a modification.

In the embodiment, the number of the through hole 168 provided on one (each) piece of the conductive layer 160 is same (six) among the conductive layers 160. However, the present disclosure is not limited to or restricted by such an aspect; it is allowable that the number of the through hole 168 provided on each of the conductive layers 160 is made to be different in at least one of the conductive layers 160. For example, as depicted in FIG. 18, it is allowable to make such a configuration wherein a number M2 (four) of the through hole 168 formed in a third conductive layer 160D from the left is made to be smaller than a number M1 (six) of the through hole 168 formed in a second conductive layer 160C from the left; and further that a number M3 (zero) of the through hole 168 formed in a fifth conductive layer 160E from the left is made to be further smaller than the number M1 (six) of the through hole 168 formed in the second conductive layer 160C from the left. As depicted in FIG. 18, in a case that the first extending portion 244 from the left is extended in the conveyance direction, an area overlapping in the stacking direction with the second conductive layer 160C from the left is referred to as a first area B1. Similarly, in a case that the second extending portion 244 from the left is extended in the conveyance direction, an area overlapping in the stacking direction with the third conductive layer 160D from the left is referred to as a second area B2; and in a case that the fourth extending portion 244 from the left is extended in the conveyance direction, an area overlapping in the stacking direction with the fifth conductive layer 160E from the left is referred to as a third area B3. In a case that the first area B1, second area B2 and third area B3 are defined in such a manner, the number M1 of the through hole 168 provided on the first area B1 is 6 (six), the number M2 of the through hole 168 provided on the second area B2 is 4 (four) and the number M3 of the through hole 168 provided on the third area B3 is 0 (zero).

As depicted in FIG. 18, the distance in the scanning direction between the center in the scanning direction of the bump 182L of the terminal 180L and the center in the scanning direction of the first area B1 is made to be a distance D1. Similarly, the distance in the scanning direction between the center in the scanning direction of the bump 182L of the terminal 180L and the center in the scanning direction of the second area B2 is made to be a distance D2; and the distance in the scanning direction between the center in the scanning direction of the bump 182L of the terminal 180L and the center in the scanning direction of the third area B3 is made to be a distance D3. In a case that the number of the through hole 168 provided on the first area B1 is made to be M1 (6 pieces), the number of the through hole 168 provided on the second area B2 is made to be M2 (4 pieces), and the number of the through hole 168 provided on the third area B3 is made to be M3 (0 pieces), relationship of M1>M2>M3 is satisfied, due to the situation that the relationship of D1<D1<D3 is satisfied. The reason for changing the number of the through hole 168 depending on the distance from the terminal 180L is as follows: in a case that the charge is supplied from the terminal 180L to a portion or location of the intermediate common electrode 241, the charge is supplied in a more concentrated manner as the distance from the terminal 180L to the portion or location of the intermediate common electrode 241 is closer. Accordingly, by providing a greater number of the through holes 168 on the conductive layer 160C which is close to the terminal 180L than on the conductive layer 160D which is far from the terminal 180L, it is possible to supply the charge efficiently to the intermediate common electrode 241.

In the above-described embodiment, the piezoelectric body 40 has the piezoelectric layer with the three-layered structure in which the electrodes are formed in the upper surface of each of the three piezoelectric layers. The present disclosure, however, is not limited to or restricted by such an aspect. It is allowable that the piezoelectric body has a piezoelectric layer with a two layered structure or three or more layered structure, and that the electrodes are formed in the lower surface of each of the piezoelectric layers. In the embodiment, although the piezoelectric body has two common electrodes (intermediate common electrode and lower common electrode), the present disclosure is not limited to or restricted by such an aspect; it is allowable that the piezoelectric body has only one common electrode. Further, the shape of the common electrode (the shape of the extending portion and the shape of the projection portion) can also be set in an arbitrary manner, as necessary. In the above-described embodiment, although the individual electrode 141 has the wide-width portion 142 and the narrow-width portion 143, the shape of the individual electrode is not necessarily limited to or restricted by such an aspect. For example, it is allowable that the width in the conveyance direction of the individual electrode is uniform in the scanning direction. Further, the number of the individual electrode, the number of individual electrode per one individual electrode row, the pitch of the individual electrodes in the scanning direction, the extent or magnitude of the shift in the scanning direction between the adjacent individual electrode rows, etc., are not limited to or restricted by those exemplified in the above-described embodiment, and can be set in an arbitrary manner.

It is allowable to combine the above-described embodiment and modification(s) as appropriate. The embodiment and the modifications described above apply the present teaching to the ink-jet head 5 configured to print image, etc., by discharging (jetting) the ink(s) to the recording paper. In the above embodiment, the ink-jet head 5 is a so-called serial ink-jet (ink discharging) head. However, the present teaching is not limited to the serial inkjet head; rather, the present teaching is applicable also to a so-called line ink-jet head. Further, the present teaching is not limited to ink-jet heads jetting ink. The present teaching is also applicable to liquid jetting apparatuses usable in a variety of kinds of usage or application other than printing image, etc. For example, it is possible to apply the present teaching to a liquid jetting apparatus configured to form a conductive pattern on a surface of a substrate by jetting a conductive liquid onto the substrate.

What is claimed is:
1. A liquid discharge head comprising:
a piezoelectric body including a plurality of piezoelectric layers which are stacked in a stacking direction, the piezoelectric body having a first end and a second end which are separated in a first direction orthogonal to the stacking direction, and a third end and a fourth end which are separated in a second direction orthogonal to the first direction and the stacking direction;
a common electrode formed in a first plane which is a plane orthogonal to the stacking direction;
a bypass trace formed in a second plane which is orthogonal to the stacking direction and of which a position in the stacking direction is different from a position in the stacking direction of the first plane; and
a plurality of individual electrodes formed in the second plane or a third plane which is orthogonal to the stacking direction and of which a position in the stacking direction is different from the position in the stacking direction of the first plane and the position in the stacking direction of the second plane,
wherein the plurality of individual electrodes construct a plurality of individual electrode rows arranged between the first end and the second end with an interval therebetween,
the plurality of individual electrode rows include:
a first individual electrode row and a second individual electrode row which is arranged side by side with respect to the first individual electrode row in the first direction, the first individual electrode row being positioned between the first end and the second individual electrode row in the first direction, the second individual electrode row being positioned between the first individual electrode row and the second end in the first direction;
individual electrodes included in the plurality of individual electrodes and constructing the first individual electrode row are aligned in the second direction;
individual electrodes included in the plurality of individual electrodes and constructing the second individual electrode row are aligned in the second direction,
the common electrode includes:
a first extending portion extending in the first direction, between the fourth end and an individual electrode which is included in the plurality of individual electrodes and which is closest to the fourth end in the second direction;
a second extending portion extending in the second direction from the first extending portion toward the third end;
a plurality of first projecting portions each of which extends in the first direction from the second extending portion toward the first end or the second end, at least a portion of each of the plurality of first projecting portions overlapping, in the stacking direction, with the individual electrodes constructing the first individual electrode row;
a third extending portion which is arranged, in the first direction, between the second extending portion and the second end and which extends in the second direction from the first extending portion toward the third end; and a plurality of second projecting portions each of which extends in the first direction from the third extending portion toward the first end or the second end, at least a portion of each of the plurality of second projecting portions overlapping, in the stacking direction, with the individual electrodes constructing the second individual electrode row, wherein the bypass trace extends in the first direction between the fourth end and the individual electrode which is closest to the fourth end in the second direction, at least a portion of the bypass trace overlapping, in the stacking direction, with the first extending portion, wherein the piezoelectric body includes: a first through hole extending in the stacking direction between the bypass trace and the first extending portion, and a second through hole extending in the stacking direction between the bypass trace and the first extending portion; and wherein the bypass trace and the first extending portion are electrically connected to each other by a conductive material arranged in the first through hole and the second through hole.

2. The liquid discharge head according to claim 1, wherein the second plane is an outermost plane of the piezoelectric body, and the bypass trace includes:
  a first layer which is a layer of the conductive material arranged in the second plane around an opening of the first through hole such that the first layer is electrically conducted with inside of the first through hole;
  a second layer which is a layer of the conductive material arranged in the second plane around an opening of the second through hole such that the second layer is electrically conducted with inside of the second through hole; and
  a third layer arranged on the first layer and the second layer.

3. The liquid discharge head according to claim 1, wherein the plurality of individual electrodes are formed in the second plane, and wherein the plurality of individual electrodes includes a dummy electrode which is arranged in the second plane between the bypass trace and the individual electrode which is closest to the fourth end in the second direction.

4. The liquid discharge head according to claim 1, wherein the plurality of individual electrodes are formed in the second plane, the plurality of individual electrodes being provided with a plurality of terminals, respectively, wherein the second plane is an outermost plane of the piezoelectric body, and wherein the liquid discharge head further comprises:
  a trace member electrically communicating with the plurality of individual electrodes and the bypass trace, the trace member being provided with a plurality of terminals; and
  a plurality of conductive joining members joining to a part of the plurality of terminals provided on the trace member and the plurality of terminals provided on the plurality of individual electrodes, respectively, and wherein at least a portion of the bypass trace is formed of a material which is same as a material forming the plurality of conductive joining members.

5. The liquid discharge head according to claim 4, wherein a length in the second direction of the bypass trace is greater than a length in the second direction of one piece of the plurality of conductive joining members which joins each of the plurality of individual electrodes and one of the plurality of terminals.

6. The liquid discharge head according to claim 4, wherein the bypass trace includes a first portion and a second portion which are formed of a conductive material same as that forming the plurality of individual electrodes and which are arranged to be separated from each other in the first direction, and a third portion which is formed of a conductive adhesive same as that forming the plurality of conductive joining members and which electrically connects the first portion and the second portion; and wherein the first through hole is formed in the first portion, and the second through hole is formed in the second portion.

7. The liquid discharge head according to claim 6, wherein the third portion connects an end portion, of the first portion, in the second direction which is closer to the fourth end and an end portion, of the second portion, in the second direction which is closer to the fourth end.

8. The liquid discharge head according to claim 6, wherein the first portion is provided with a first narrow-width portion and a first wide-width portion of which length in the second direction is greater than a length in the second direction of the first narrow-width portion;

the second portion is provided with a second narrow-width portion and a second wide-width portion of which length in the second direction is greater than a length in the second direction of the second narrow-width portion; and the first narrow-width portion and the second narrow-width portion are arranged to face each other in the first direction.

9. The liquid discharge head according to claim 8, wherein the third portion extends in the first direction so as to connect the first wide-width portion and the second wide-width portion with each other.

10. The liquid discharge head according to claim 9, further comprising a conductive layer of which length in the first direction is greater than a spacing distance in the first direction between the first narrow-width portion and the second narrow-width portion, and which is not connected to the bypass trace, wherein a position in the second direction of the conductive layer is between, in the second direction, the third end and the first portion.

11. The liquid discharge head according to claim 10, wherein the conductive layer is formed of a conductive material same as that forming the plurality of individual electrodes.

12. The liquid discharge head according to claim 9, further comprising a conductive layer of which length in the first direction is greater than a spacing distance in the first direction between the first narrow-width portion and the second narrow-width portion, wherein the conductive layer connects an end portion, of the first portion, in the second direction which is closer to the third end and an end portion, of the second portion, in the second direction which is closer to the third end.

13. The liquid discharge head according to claim 12, wherein the plurality of individual electrodes are formed in the second plane; and the bypass trace extends in the first direction so that a position, of the conductive layer, in the second direction is overlapped with positions, of the first and second individual electrode rows, in the second direction.

14. The liquid discharge head according to claim 6, wherein the trace member is provided with a plurality of traces connected to the plurality of individual electrodes, respectively, and a trace protective film covering the plurality of traces; and the third portion is arranged, in the stacking direction, at a position at which the third portion does not overlap with the trace protective film of the trace member.

15. A liquid discharge head comprising:

a piezoelectric body including a plurality of piezoelectric layers which are stacked in a stacking direction, the piezoelectric body having a first end and a second end which are separated in a first direction orthogonal to the stacking direction, and a third end and a fourth end which are separated in a second direction orthogonal to the first direction and the stacking direction; and a common electrode formed in a first plane which is a plane orthogonal to the stacking direction;

a bypass trace formed in a second plane which is orthogonal to the stacking direction and of which a position in the stacking direction is different from a position in the stacking direction of the first plane, wherein the common electrode includes:

a first extending portion extending in the first direction;

a second extending portion extending in the second direction from the first extending portion toward the third end;

a plurality of first projecting portions each of which extends in the first direction from the second extending portion toward the first end or the second end;

a third extending portion which is arranged, in the first direction, between the second extending portion and the second end and which extends in the second direction from the first extending portion toward the third end; and a plurality of second projecting portions each of which extends in the first direction from the third extending portion toward the first end or the second end, wherein the bypass trace extends in the first direction, at least a portion of the bypass trace overlapping, in the stacking direction, with the first extending portion;

wherein the piezoelectric body includes:

a first through hole extending in the stacking direction between the bypass trace and the first extending portion; and a second through hole extending in the stacking direction between the bypass trace and the first extending portion, and wherein the bypass trace and the first extending portion are electrically connected to each other by a conductive material arranged in the first through hole and the second through hole.

16. A liquid discharge head comprising:

a piezoelectric body including a plurality of piezoelectric layers which are stacked in a stacking direction, the piezoelectric body having a first end and a second end which are separated in a first direction orthogonal to the stacking direction, and a third end and a fourth end which are separated in a second direction orthogonal to the first direction and the stacking direction;

a common electrode formed in a second plane which is a plane orthogonal to the stacking direction and of which a position in the stacking direction is different from a position in the stacking direction of a first plane, the first plane being an outermost plane of the piezoelectric body; and a plurality of individual electrodes formed in the first plane, or a third plane which is orthogonal to the stacking direction and of which a position in the stacking direction is different from the position in the stacking direction of the first plane and the position in the stacking direction of the second plane, wherein the plurality of individual electrodes construct a plurality of individual electrode rows arranged between the first end and the second end with an interval therebetween;

the plurality of individual electrode rows include:

a first individual electrode row and a second individual electrode row which is arranged side by side with respect to the first individual electrode row in the first direction, the first individual electrode row being positioned between the first end and the second individual electrode row in the first direction, the second individual electrode row being positioned between the first individual electrode row and the second end in the first direction, wherein individual electrodes included in the plurality of individual electrodes and constructing the first individual electrode row are aligned in the second direction, wherein individual electrodes included in the plurality of individual electrodes and constructing the second individual electrode row are aligned in the second direction, wherein the common electrode includes:

a first extending portion extending in the first direction, between the fourth end and an individual electrode which is included in the plurality of individual electrodes and which is closest to the fourth end in the second direction;

a second extending portion extending in the second direction from the first extending portion toward the third end;

a plurality of first projecting portions each of which extends in the first direction from the second extending portion toward the first end or the second end, at least a portion of each of the plurality of first projecting portions overlapping, in the stacking direction, with the individual electrodes constructing the first individual electrode row;

a third extending portion which is arranged, in the first direction, between the second extending portion and the second end and which extends in the second direction from the first extending portion toward the third end; and a plurality of second projecting portions each of which extends in the first direction from the third extending portion toward the first end or the second end, at least a portion of each of the plurality of second projecting portions overlapping, in the stacking direction, with the individual electrodes constructing the second individual electrode row, wherein the piezoelectric body includes a plurality of through holes including at least one piece of a first through hole extending in the stacking direction from the first plane to the first extending portion, and at least one piece of a second through hole extending in the stacking direction from the first plane to the first extending portion, and wherein a conductive material is filled in inside of each of the first and second through holes, wherein a position in the first direction of the first through hole is same as a position in the first direction of the second extending portion, and wherein a position in the first direction of the second through hole is same as a position in the first direction of the third extending portion.

17. The liquid discharge head according to claim 16, wherein the first plane is formed with:
   a first film section which is a film of the conductive material and which is arranged around an opening of the first through hole such that the first film section is electrically conducted with the conductive material arranged in the inside of the first through hole; and
   a second film section which is a film of the conductive material and which is arranged around an opening of the second through hole such that the second film section is electrically conducted with the conductive material arranged in the inside of the second through hole.

18. The liquid discharge head according to claim 16, wherein the first plane is formed with a conductive layer conducted with the conductive material arranged in the plurality of through holes, and extending in the first direction between the fourth end and an individual electrode which is included in the plurality of individual electrodes and which is closest to the fourth end in the second direction;
   the individual electrodes included in the plurality of individual electrodes and constructing the first individual electrode row are aligned in the second direction at a pitch P;
   the individual electrodes included in the plurality of individual electrodes and constructing the second individual electrode row are aligned in the second direction at the pitch P;
   a relationship of L2<L1 is satisfied in a case that:
      a distance in the second direction between an end of the conductive layer, the end being included in both ends in the second direction of the conductive layer and being located farther from the fourth end, and an end of an individual electrode which is included in the individual electrodes constructing the first individual electrode row and which is closest to the fourth end in the second direction, the end being included in both ends in the second direction of the individual electrode and being closer to the fourth end, is a distance L1, and
      a distance in the second direction between the end of the conductive layer, and an end of an individual electrode which is included in the individual electrodes constructing the second individual electrode row and which is closest to the fourth end in the second direction, the end being included in both ends in the second direction of the individual electrode and being closer to the fourth end, is a distance L2; and
   a relationship of N2<N1 is satisfied in a case that:
      a number of the plurality of through holes formed in the first plane at a first area, of which a position in the first direction is same as a position in the first direction of the second extending portion, is a number N1, and
      a number of the plurality of through holes formed in the first plane at a second area, of which a position in the first direction is same as a position in the first direction of the third extending portion, is a number N2.

19. The liquid discharge head according to claim 18, wherein the plurality of individual electrode rows further include a third individual electrode row arranged between the second individual electrode row and the second end in the first direction;
   individual electrodes included in the plurality of individual electrodes and constructing the third individual electrode row are aligned in the second direction at the pitch P;
   the common electrode includes:
      a fourth extending portion which is arranged, in the first direction, between the third extending portion and the second end and which extends in the second direction from the first extending portion toward the third end; and
      a plurality of third projecting portions each of which extends in the first direction from the fourth extending portion toward the first end or the second end, at least a portion of each of the plurality of third projecting portions overlapping, in the stacking direction, with the individual electrodes constructing the third individual electrode row,
   wherein the distance L1, the distance L2 and a distance L3 satisfy a magnitude relationship of L3<L2<L1, in a case that:
      a distance in the second direction between the end of the conductive layer, and an end of an individual electrode which is included in the individual electrodes constructing the third individual electrode row and which is closest to the fourth end in the second direction, the end being included in both ends in the second direction of the individual electrode and being closer to the fourth end, is the distance L3; and
   wherein any through hole is not formed in the first plane at a third area of which a position in the first direction is same as a position in the first direction of the fourth extending portion.

20. The liquid discharge head according to claim 16, wherein the first plane is formed with a conductive layer conducted with the conductive material arranged in the plurality of through holes, and extending in the first direction between the fourth end and an individual electrode which is included in the plurality of individual electrodes and which is closest to the fourth end in the second direction;
   the liquid discharge head further comprises:
      a trace member electrically communicating with the plurality of individual electrodes and the conductive layer, a plurality of terminals being provided on the trace member; and
      a plurality of conductive joining members joining the plurality of individual electrodes and a part of the plurality of terminals provided on the trace member and joining the conductive layer and another part of the plurality of terminals provided on the trace member, and
   wherein a relationship of D1<D2 and M1>M2 is satisfied in a case that:
      a number of through holes included in the plurality of through holes and formed in the first plane at a first area of which a position in the first direction is same as a position in the first direction of the second extending portion is a number M1;

a number of through holes included in the plurality of through holes and formed in the first plane at a second area of which a position in the first direction is same as a position in the first direction of the third extending portion is a number M2;

a distance in the first direction between center in the first direction of a conductive joining member which is included in the plurality of conductive joining members and which is joined to the conductive layer, and center in the first direction of the first area is a distance D1; and a distance in the first direction between the center in the first direction of the conductive joining member which is included in the plurality of conductive joining members and which is joined to the conductive layer, and center in the first direction of the second area is a distance D2.

21. The liquid discharge head according to claim 20, wherein the plurality of individual electrode rows further include a third individual electrode row arranged between the second individual electrode row and the second end in the first direction;

individual electrodes included in the plurality of individual electrodes and constructing the third individual electrode row are aligned in the second direction at a pitch P;

the common electrode includes:
a fourth extending portion which is arranged, in the first direction, between the third extending portion and the second end and which extends in the second direction from the first extending portion toward the third end; and a plurality of third projecting portions each of which extends in the first direction from the fourth extending portion toward the first end or the second end, at least a portion of each of the plurality of third projecting portions overlapping, in the stacking direction, with the individual electrodes constructing the third individual electrode row, and wherein a relationship of D1<D2<D3 and M3=0 is satisfied in a case that:
a number of through holes included in the plurality of through holes and formed in the first plane at a third area of which a position in the first direction is same as a position in the first direction of the fourth extending portion is a number M3; and a distance in the first direction between the center in the first direction of the conductive joining member which is included in the plurality of conductive joining members and which is joined to the conductive layer, and center in the first direction of the third area is a distance D3.

22. The liquid discharge head according to claim 20, wherein the conductive layer includes:

a first layer which is formed of a same material as that forming the plurality of individual electrodes, and a second layer which is formed of a same material as that forming the plurality of conductive joining members; and at least a portion of the second layer is arranged, in the stacking direction, at a position above the first layer.

23. A liquid discharge head comprising:
a piezoelectric body including a plurality of piezoelectric layers which are stacked in a stacking direction, the piezoelectric body having a first end and a second end which are separated in a first direction orthogonal to the stacking direction, and a third end and a fourth end which are separated in a second direction orthogonal to the first direction and the stacking direction; and a common electrode formed in a second plane which is a plane orthogonal to the stacking direction and of which a position in the stacking direction is different from a position in the stacking direction of a first plane, the first plane being an outermost plane of the piezoelectric body, wherein the common electrode includes:
a first extending portion extending in the first direction, between the first end and the second end;
a second extending portion extending in the second direction from the first extending portion toward the third end;
a plurality of first projecting portions each of which extends in the first direction from the second extending portion toward the first end or the second end;
a third extending portion which is arranged, in the first direction, between the second extending portion and the second end and which extends in the second direction from the first extending portion toward the third end; and
a plurality of second projecting portions each of which extends in the first direction from the third extending portion toward the first end or the second end, wherein the piezoelectric body is provided with at least one piece of a first through hole extending in the stacking direction from the first plane to the first extending portion, and at least one piece of a second through hole extending in the stacking direction from the first plane to the first extending portion, wherein a conductive material is filled in inside of each of the first and second through holes, wherein a position in the first direction of the first through hole is same as a position in the first direction of the second extending portion, and wherein a position in the first direction of the second through hole is same as a position in the first direction of the third extending portion.

* * * * *